United States Patent
Matsunaga et al.

(10) Patent No.: US 6,859,395 B2
(45) Date of Patent: Feb. 22, 2005

(54) NAND TYPE FLASH EEPROM IN WHICH SEQUENTIAL PROGRAMMING PROCESS IS PERFORMED BY USING DIFFERENT INTERMEDIATE VOLTAGES

(75) Inventors: Yasuhiko Matsunaga, Kawasaki (JP); Toshitake Yaegashi, Yokohama (JP); Fumitaka Arai, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 25 days.

(21) Appl. No.: 10/405,233

(22) Filed: Apr. 3, 2003

(65) Prior Publication Data

US 2004/0105308 A1 Jun. 3, 2004

(30) Foreign Application Priority Data

Nov. 29, 2002 (JP) ........................................ 2002-349199

(51) Int. Cl.[7] .............................................. G11C 16/04
(52) U.S. Cl. ............................ 365/185.18; 365/185.17; 365/185.11
(58) Field of Search ........................ 365/185.17, 185.18, 365/185.11, 189.09

(56) References Cited

U.S. PATENT DOCUMENTS 5,969,990 A * 10/1999 Arase .................... 365/185.25
6,363,010 B2 * 3/2002 Tanaka et al. ......... 365/185.03
2002/0126532 A1   9/2002 Matsunaga et al.

FOREIGN PATENT DOCUMENTS

| JP | 08/279297 | 10/1996 |
|----|-----------|---------|
| JP | 10/283788 | 10/1998 |
| JP | 2002/260390 | 9/2002 |

OTHER PUBLICATIONS

Kang–Deog Shu, et al. "A 3.3 V 32 Mb NAND Flash Memory With Incremental Step Pulse Programming Scheme" IEEE Journal of Solid–State Circuits, vol. 30, No. 11, Nov. 1995, pp. 1149–1155.

* cited by examiner

Primary Examiner—Vu A. Le
(74) Attorney, Agent, or Firm—Oblon, Spivak, McClelland, Maier & Neustadt, P.C.

(57) ABSTRACT

A nonvolatile semiconductor memory device includes a NAND memory cell array, booster circuit, row decoder, bit line control circuit and column decoder. In the device, the magnitude of intermediate voltage applied to the control gates of memory transistors from the booster circuit via the row decoder is changed according to the position of a selected control gate line when data is sequentially programmed into the memory transistors in the memory cell array. Alternatively, a plurality of different intermediate voltages are applied when data is simultaneously programmed into memory transistors connected to the selected control gate line.

41 Claims, 25 Drawing Sheets

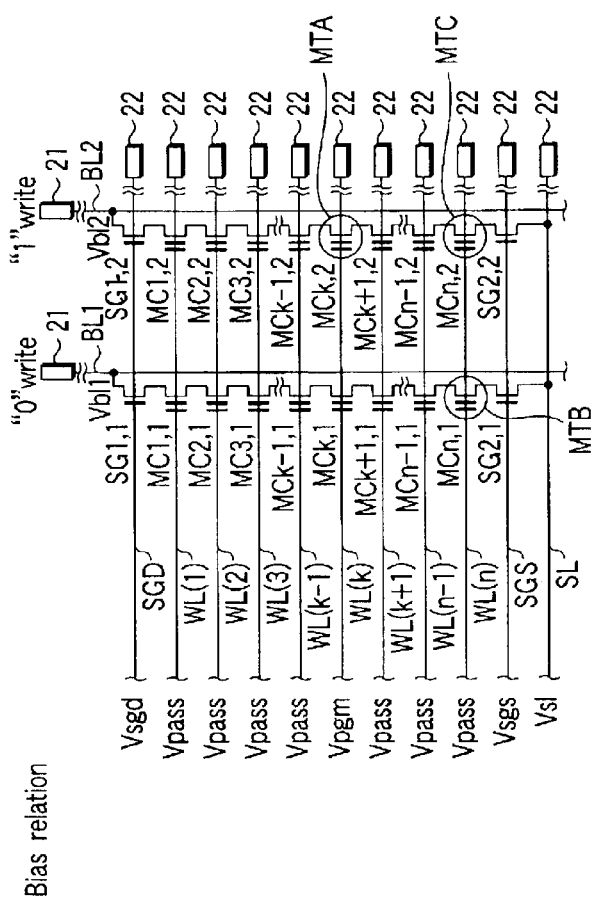
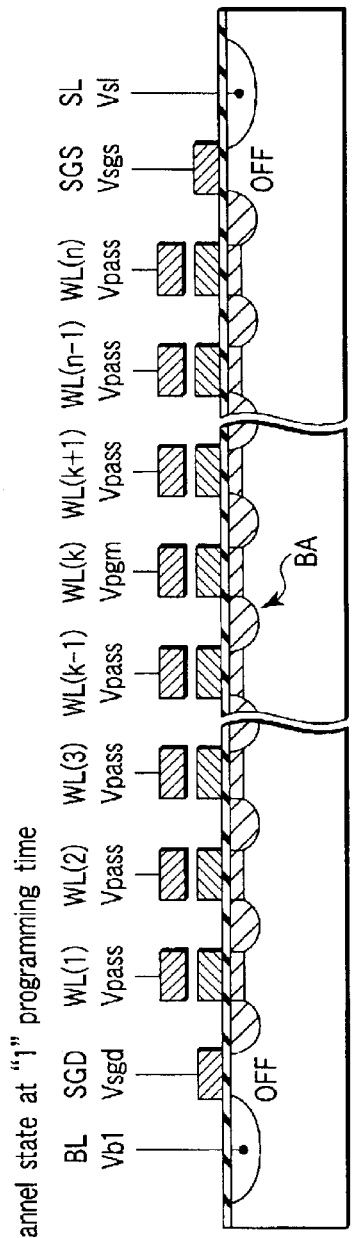
FIG. 1A PRIOR ART
FIG. 1B PRIOR ART

Bias relation

Channel state at "1" programming time

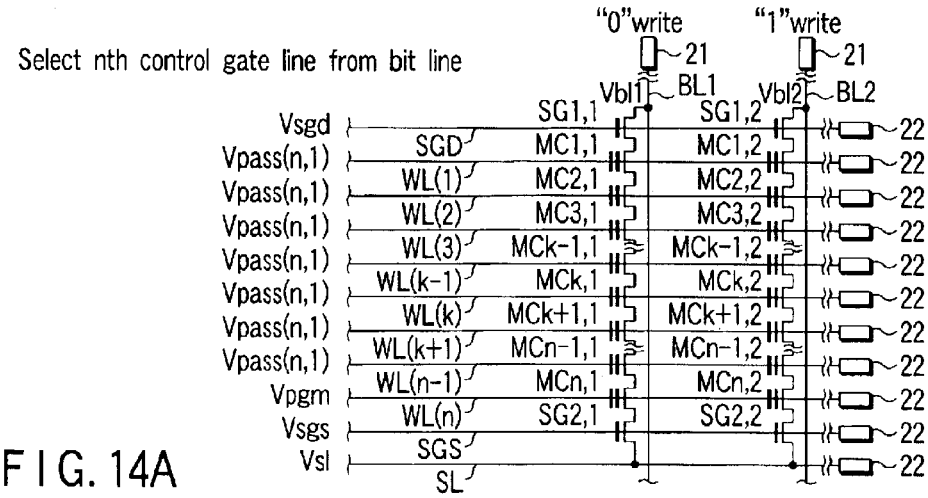
F I G. 14A
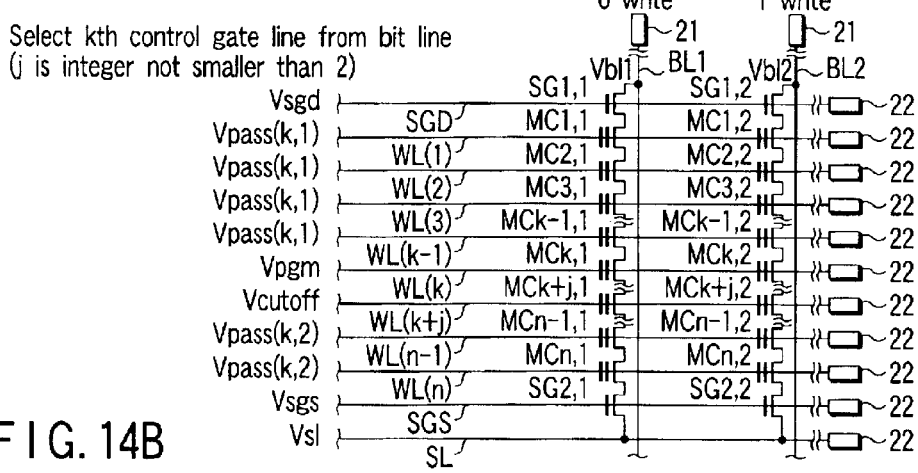
F I G. 14B
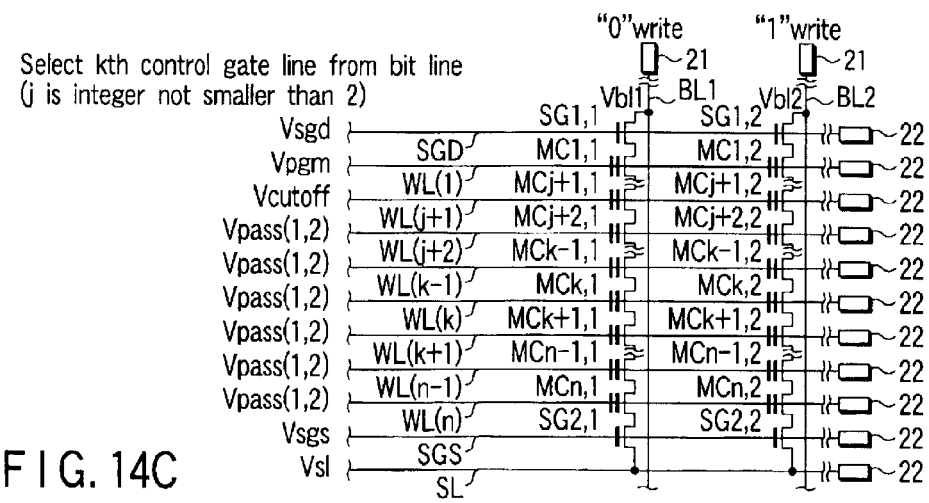
F I G. 14C

Select kth control gate line from bit line
(k>m, m is integer not smaller than 1 and not larger than n)

Select kth control gate line from bit line
(k≤m, m is integer not smaller than 1 and not larger than n)

Select kth control gate line from bit line
(k>m, m is integer not smaller than 1 and not larger than n)

Select kth control gate line from bit line
(k≤m, m is integer not smaller than 1 and not larger than n)

Select kth control gate line from bit line
(k>m, m is integer not smaller than 1 and not larger than n)

Select kth control gate line from bit line
(k≦m, m is integer not smaller than 1 and not larger than n, i is integer not smaller than 1)

Select kth control gate line from bit line
(k>m, m is integer not smaller than 1 and not larger than n)

Select kth control gate line from bit line
(k≤m, m is integer not smaller than 1 and not larger than n, i, j is integer not smaller than 1)

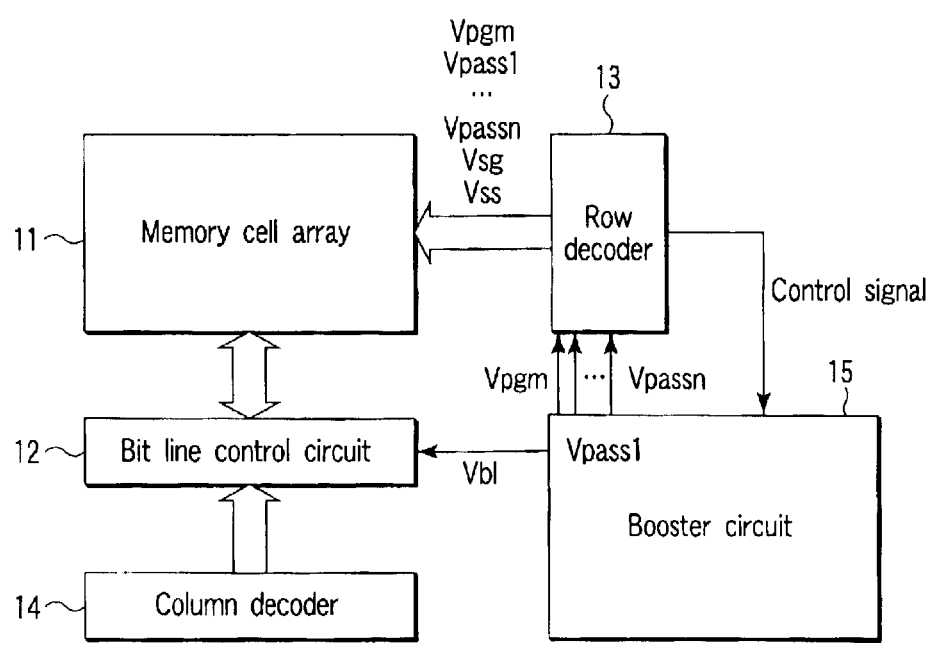
F I G. 20

Figures 23A, 23B, 23C:
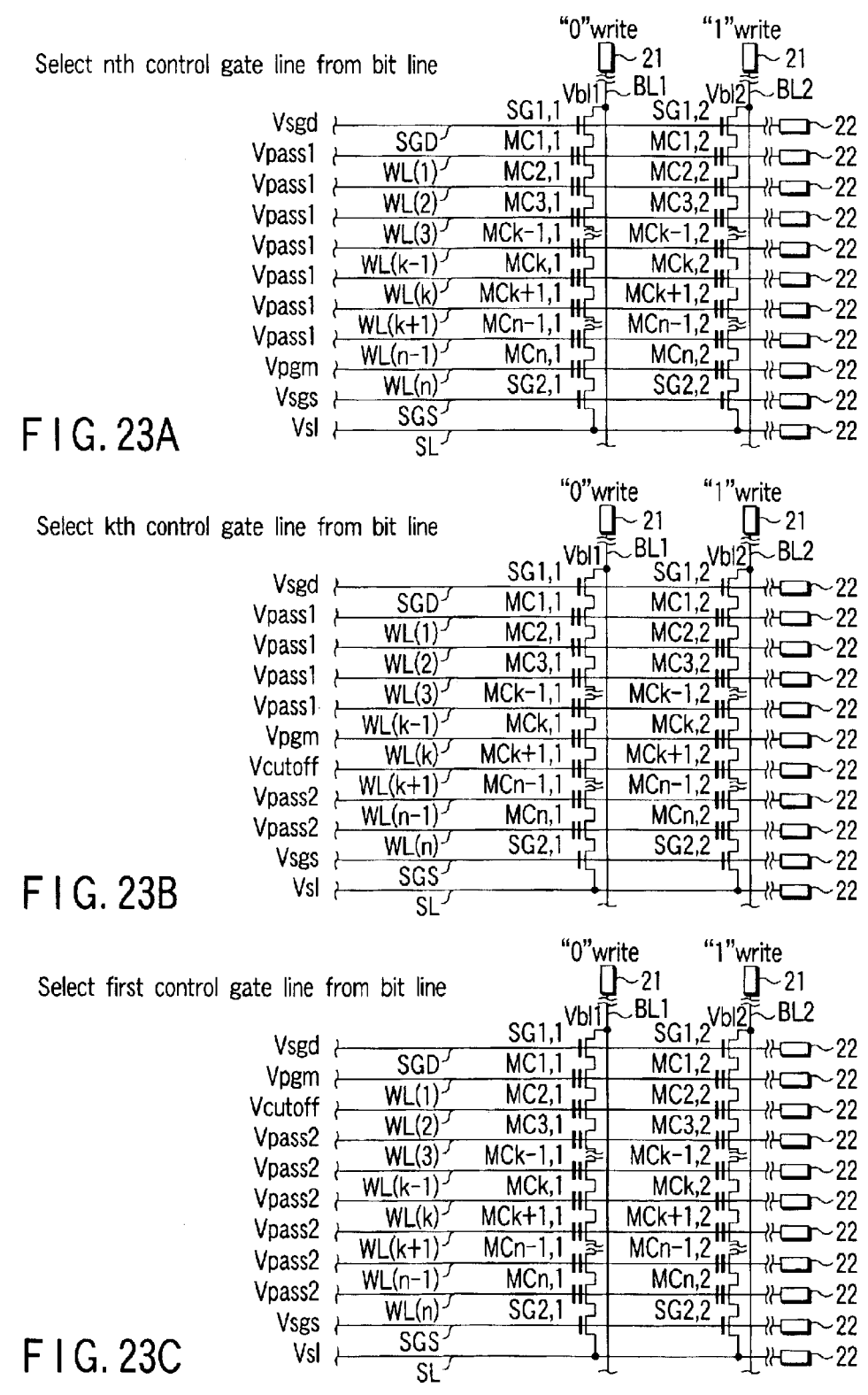

FIG. 23A — Select nth control gate line from bit line

FIG. 23B — Select kth control gate line from bit line

FIG. 23C — Select first control gate line from bit line

NAND TYPE FLASH EEPROM IN WHICH SEQUENTIAL PROGRAMMING PROCESS IS PERFORMED BY USING DIFFERENT INTERMEDIATE VOLTAGES

CROSS-REFERENCE TO RELATED APPLICATIONS

This application is based upon and claims the benefit of priority from the prior Japanese Patent Application No. 2002-349199, filed Nov. 29, 2002, the entire contents of which are incorporated herein by reference.

BACKGROUND OF THE INVENTION

1. Field of the Invention

This invention relates to a nonvolatile semiconductor memory device, and more specifically, to a data programming system of a NAND type flash EEPROM, for example.

2. Description of the Related Art

As a nonvolatile semiconductor memory device which can be electrically rewritten and formed with high integration density, a NAND type flash EEPROM is well known in the art. A memory transistor in the NAND type flash EEPROM has a stacked gate structure in which a charge storage layer (floating gate) and control gate are stacked and formed above a semiconductor substrate with an insulating film disposed therebetween. A NAND cell unit is configured by serially connecting a plurality of memory transistors in a column direction while adjacent ones of the memory transistors commonly have a source or drain and connecting selection gate transistors to both ends of the series-connected memory transistor circuit.

A memory cell array is configured by arranging a plurality of NAND cell units with the above-described structure in a matrix form. In this case, a group of NAND cell units arranged in a row direction is called a NAND cell block. The gates of selection gate transistors arranged on the same row are commonly connected to a corresponding one of selection gate lines and the control gates of memory transistors arranged on the same row are commonly connected to a corresponding one of control gate lines. If n memory transistors are serially connected in the NAND cell unit, the number of control gate lines contained in one NAND cell block is n.

The memory transistor stores data in a nonvolatile fashion according to the charge storage state of the floating gate. More specifically, the memory transistor stores binary data on the assumption that a state in which electrons are injected from the channel into the floating gate to set the threshold voltage high is defined as "0" data and a state in which electrons in the floating gate are discharged into the channel to set the threshold voltage low is defined as "1" data. Recently, a multi-value data storage process such as a four-value data storage process is performed by more finely dividing the distribution of the threshold voltage.

When programming data, first, data items in the NAND cell block are simultaneously erased in advance. The erase process is performed by setting all of the control gate lines (word lines) of a selected NAND cell block to low voltage Vss (for example, 0V) and applying high positive voltage Vera (erase voltage, for example, 20V) to a p-type well region in which the memory cell array is formed to discharge electrons in the floating gates into the channel regions. As a result, data items in the NAND cell block are all set to "1" data. The unit of data to be simultaneously erased is not limited to a NAND cell block unit and can be set to a whole chip unit, for example.

The data programming process is simultaneously performed for a plurality of memory transistors connected to a selected control gate line after the above-described simultaneous data erase process. The unit of data to be programmed is generally defined as one page. In recent years, a plurality of pages are allocated for one control gate line in some cases. The order in which data is programmed into the memory transistors in the NAND cell block is determined based on a system in which data is programmed in a random order (random programming process) and a system in which data is sequentially programmed in one direction (sequential programming process). In the sequential programming process, generally, data is programmed in order from the source-side memory transistor.

If high positive voltage Vpgm (program voltage, for example, 20V) is applied to a selected control gate line in the simultaneous programming process, electrons are injected from the channel of the memory transistor into the floating gate in the case of "0" data (so-called "0" programming or "0" write). In this case, injection of electrons is inhibited in the case of "1" data (so-called program inhibition, "1" programming or "1" write). Thus, two types of data programming operations are simultaneously performed. In order to realize the above simultaneous programming process, it is necessary to control the channel voltage of the memory transistor according to program data. For example, in the case of "0" data, the channel voltage is kept low so as to apply a strong electric field to the gate insulating film under the floating gate when the program voltage Vpgm is applied to the control gate. In the case of "1" data, the channel voltage is boosted so as to make weak the electric field applied to the gate insulating film and inhibit injection of electrons into the floating gate. At this time, if the channel voltage is insufficiently boosted, electrons are injected so that the threshold voltage of the memory transistor to be subjected to the "1" programming process will be changed. The phenomenon is hereinafter referred as "erroneous programming" or "write error". Therefore, in order to realize the programming operation of the NAND type flash EEPROM, it is necessary to suppress a variation in the threshold voltage due to erroneous programming within a specified range so as not to cause the erroneous operation.

Various types of channel voltage control methods at the programming time are provided. Among them, the self-boost (SB) programming method for setting all of the channel regions of the NAND cell unit into an electrically floating state in the "1" data programming case and boosting the channel voltage by use of capacitive coupling with the control gate is most popularly used. The self-boost programming method is described in K. D. Suh et. al., IEEE Journal of Solid-State Circuits, vol. 30, No. 11 (1995) pp. 1149–1156, for example.

Next, the SB method is more specifically explained with reference to FIG. 1A. Before applying program voltage to the control gate line, bit line voltages Vb11, Vb12 are applied to bit lines BL1, BL2 according to "0" data, "1" data. For example, as Vb11, 0V is used, and as Vb12, a voltage of 1.2V to 4.0V is used, for example. Selection gate transistors SG1,1, SG1,2, . . . on the bit line side are required to be turned ON in order to transfer the bit line voltage Vb11 in the NAND cell unit in which "0" data is programmed. Also, in this case, the selection gate transistors on the bit line side are automatically set into the cut-off state at the channel voltage boosting time in the NAND cell unit in which "1" data is programmed. That is, gate voltage Vsgd which satisfies a condition of Vth_sgd(0)<Vsgd<Vb12+Vth_sgd (Vb12) is applied to the selection gate line on the bit line side. In this case, Vth_sgd indicates the threshold voltage of the selection gate transistor on the bit line side and the symbols in the parentheses indicate back bias voltage applied to the source of the selection gate transistor on the bit line side. Generally, as the voltage Vsgd, the same voltage (in this case, Vb12) as the bit line voltage in the case of "1" data programming is given in many cases. Voltage Vsgs (for example, 0V) which sets selection gate transistors SG2,1, SG2,2, . . . on the source side into the cut-off state is applied to the selection gate line on the source side. After this, program voltage Vpgm is applied to the selected control gate line used for programming and intermediate voltage Vpass (for example, 10V) which is lower than Vpgm is applied to the other non-selected control gate lines. In the NAND cell unit in which a "0" data programming process is performed, the channel voltage is fixed at Vb11 and a strong electric field is applied to the gate insulating film of the selected memory transistor so as to inject electrons into the floating gate by the tunnel effect. In the case of "1" programming, the selection gate transistors on both ends of the NAND cell unit are turned OFF to electrically isolate the memory transistors as shown in FIG. 1B. Therefore, the channels and diffusion layers of all of the memory transistors are set into the electrically floating state while they are serially connected. As a result, the voltage of the channel and diffusion layer is boosted to certain channel voltage Vch by use of capacitive coupling with the control gate line to make weak the electric field applied to the gate insulating film and suppress injection of electrons into the floating gate.

The channel voltage Vch at the self-boosting time is expressed by the following series of equations.

$$Vch = Vch\_init + Cr1 \cdot (Vpass - Vthbk - Vch\_init) + Cr2 \cdot (Vpgm - Vth - Vch\_init) \quad (1)$$

$$Vch\_init = Vsgd - Vth\_sgd \quad (2)$$

$$Ct = n \cdot Cch + n \cdot Cins \quad (3)$$

$$Cr1 = (n-1) \cdot Cins / Ct \quad (4)$$

$$Cr2 = Cins / Ct \quad (5)$$

where Vch_init indicates an initial value of the channel voltage, Vth the threshold voltage of the selected memory transistor, Vthbk the threshold voltage of the non-selected memory transistor, Cp the coupling ratio of the memory transistor, Cins the capacitance between the control gate and substrate of one memory transistor, Cch the sum of the junction capacitance of the diffusion layer and the depletion capacitance of the channel portion of one memory transistor, Ct the total capacitance connected to the boost region, and n the number of memory transistors contained in the NAND boost region.

When the control gate voltage is gradually raised at the Vpass pulse application time and reaches (Vthbk+Vch_init), the boost region (the channels and diffusion layers of all of the memory transistors in the SB system) is electrically isolated from the selection gate transistors. The initial voltage transferred to the channel until then is Vch_init.

According to the equation (1), the channel voltage Vch is associated with Vpass and Vpgm with the boost ratios Cr1 and Cr2. As indicated by the equations (4), (5), the SB system has a feature that the channel voltage Vch is almost determined by Vpass since Cr2 is as small as 1/(n−1) times Cr1.

As one of the channel voltage control systems other than the self-boost system, a local self-boost system (LSB) as shown in FIGS. 2A and 2B is known. The local self-boost system is described in Jpn. Pat. Appln. KOKAI Publication No. 08-279297, for example. In the above system, a sequential programming method for sequentially programming data starting from the control gate line on the source side as described before is generally used. As shown in FIG. 2B, the system is to set the memory transistors on both sides of the selected memory transistor into the cut-off state, electrically isolate only the channel and diffusion layers (boosted region BA1 in FIG. 2B) of the selected memory transistor from the remaining memory transistors, set the above regions into the electrically floating state and boost the voltage thereof. Thus, the higher channel voltage can be attained in comparison with the case of the SB system. Specifically, program voltage Vpgm is applied to the control gate line of the selected memory transistor and low voltage Vcutoff (for example, 0V) which cuts off the memory transistor is applied to the control gate lines of the memory transistors which are adjacent thereto. Intermediate voltage Vpass between Vpgm and Vcutoff is applied to the other non-selected control gate lines (FIG. 2A). When the equations described before are taken into consideration, the number of memory transistors boosted is "1" in the LSB system (n=1), and therefore, the boost ratio Cr2 becomes equal to Cins/(Cch+Cins) and is larger than in the case of the SB system. In addition, since the boost ratio is multiplied by the program voltage Vpgm, the third item in the equation (1) becomes extremely large (the second item is "0") and the channel voltage to be reached becomes higher than in the case of the SB system.

As the other channel voltage control system, an erased area self-boost (EASB) system as shown in FIGS. 3A and 3B is proposed. The erased area self-boost system is described in Jpn. Pat. Appln. KOKAI Publication No. 10-283788, for example. The system is based on the sequential programming method for sequentially programming data starting from the control gate line on the source side as described before. As shown in FIG. 3A, low voltage Vcutoff is applied to the control gate line of the memory transistor which lies adjacent to and on the source side of the selected memory transistor so as to cut off the memory transistor. Program voltage Vpgm is applied to the control gate line of the selected memory transistor and intermediate voltage Vpass is applied to the other non-selected control gate lines. In this case, as shown in FIG. 3B, the boosted area is limited to the selected memory transistor and the memory transistors which lie on the bit line side with respect to the selected memory transistor (boosted area BA1 in FIG. 3B). Because of the sequential programming, all of the memory transistors in the boosted area are set in the erased state and the second item in the equation (1) becomes sufficiently large, and therefore, channel voltage which is higher than in the case of the SB system can be obtained.

Even if any type of the channel voltage control system is used, it is definitely necessary to optimize pulse voltages Vpgm, Vpass applied to the control gates of the memory transistors at the programming time in order to attain high resistance to erroneous programming. The program voltage Vpgm is unconditionally determined based on the programming characteristic of the memory transistor. Therefore, the way of determining the intermediate voltage Vpass has an extremely important meaning with respect to the programming characteristic. Generally, the intermediate voltage Vpass is determined by attaining a balance between two types of erroneous programming stresses occurring while data is programmed into the memory transistors connected to all of the control gate lines. The two types of erroneous programming stresses are explained in detail with reference to FIG. 1A by taking the case of the SB system as an example.

The first erroneous programming stress is stress applied to the memory transistor connected to the selected control gate line in the NAND cell unit in which the "1" programming operation is performed (refer to a memory transistor MTA in FIG. 1A). If stress voltage is defined as "a difference between control voltage and channel voltage", then the stress voltage becomes equal to (Vpgm−Vch). The erroneous programming stress is referred to as "Vpgm stress". The Vpgm stress occurs only once in one memory transistor which stores "1" data while all of the control gate lines are selected and used for programming.

The second erroneous programming stress is stress applied to the non-selected memory transistor in the NAND cell unit in which the "0" programming operation is performed (refer to a memory transistor MTB in FIG. 1A). In this case, the control gate voltage is Vpass, the channel voltage is Vbl1 (for example, 0V) and the stress voltage is Vpass−Vbl1≈Vpass. The erroneous programming stress is referred to as "Vpass stress". However, it should be noted that, if the number of control gate lines is "n", the Vpgm stress applied to one "1" data memory transistor occurs (n−1) times at maximum while all of the control gate lines are selected and used for programming and the "Vpgm stress" is defined by the total sum of the stresses. Therefore, the memory transistor MTB in FIG. 1A expresses a state in which the Vpass stress of one control gate line is applied and a value which is equal to (n−1) times the above Vpass stress is used as the "Vpass stress".

There occurs a case wherein stress voltage is "Vpass−Vch" as indicated by a memory transistor MTC in FIG. 1A as erroneous programming stress applied to the memory transistor, but the above stress is sufficiently small in comparison with the above two types of stresses and is neglected.

As described above, the "total erroneous programming stress" which the memory transistor undergoes when "1" data is programmed is given as the sum of Vpgm stress and Vpass stress.

The Vpass optimization method is performed as follows. First, as shown in FIG. 4, Vpass is plotted on the abscissa and threshold voltages after application of the two types of erroneous programming stresses are plotted on the ordinate. In the case of the SB system, since the channel voltage Vch becomes higher as the intermediate voltage Vpass becomes higher, the Vpgm stress characteristic generally shows the tendency to move down to the right as indicated by a solid line. On the other hand, the Vpass stress characteristic shows the tendency to move up to the right as indicated by broken lines indicating that the threshold voltage increases in proportion to an increase in Vpass. That is, the curves of the Vpgm stress and Vpass stress show the characteristics which are contrary to each other and have an intersection. In order to minimize both of the stresses, generally, a Vpass value near the intersection (Vpass_optimum in FIG. 4) is used. Further, as the threshold voltage at the intersection (Vth_intersection) is lower, the programming characteristic is better. In this example, the SB system is explained, but the basic tendency is the same in the LSB system and EASB system. However, the Vpass stress characteristic is the same as that in the SB system, but it is considered that the Vpgm stress becomes smaller than that in the SB system, and therefore, the intersection is shifted down to the left (erroneous programming stress decreases).

According to the trend of miniaturization of recent semiconductor integrated circuit devices, the gate length of a memory transistor of the NAND type flash EEPROM will soon become smaller than 0.1 $\mu$m. With the further miniaturization, a lowering in the threshold voltage due to the short channel effect becomes more significant. Since a significant lowering in the threshold voltage is not desirable from the viewpoint of reliability, a lowering in the threshold voltage due to the short channel effect is compensated for by enhancing the concentration of impurity used in the channel ion-implantation process. As a result, the Vpass stress can be kept at substantially the same level without depending on scaling. However, since an increase in the channel impurity concentration leads to a reduction in the boost ratio expressed in the equations (4), (5), it lowers the channel voltage Vch and gives rise to an increase in the Vpgm stress. As the result of this, the scaling tends to increase the erroneous programming stress.

Further, as the technique for increasing the memory capacity without scaling, recently, a multi-value storage system is highly expected. However, if the multi-value storage system is used, the threshold voltage range of the memory transistor used for data recording is enlarged, and therefore, it is inevitably necessary to enhance the program voltage Vpgm. Since an increase in the programming voltage makes the Vpgm stress larger, a method for more stably preventing the erroneous programming is required in order to realize the multi-value storage system.

Based on the above trend, it is desired to improve the programming characteristic of the nonvolatile semiconductor memory device.

BRIEF SUMMARY OF THE INVENTION

A nonvolatile semiconductor memory device according to an aspect of the present invention comprises a memory cell array having a plurality of memory cell blocks arranged in a column direction and control gate lines provided for each of the plurality of memory cell blocks, each of the memory cell blocks including a plurality of memory cell units arranged in a row direction and each connected to the control gate lines, each of the plurality of memory cell units including a plurality of electrically data programmable and erasable memory transistors which are arranged in the column direction and whose current paths are serially connected, a first selection gate transistor having a current path connected at one end to one end of a current path of the series-connected memory transistors and connected at the other end to a bit line, and a second selection gate transistor having a current path connected at one end to the other end of the current path of the series-connected memory transistors and connected at the other end to a source line, and each of the control gate lines being commonly connected to control gates of those of the memory transistors which are arranged on a corresponding one of rows in the memory cell units of each of the memory cell blocks, a booster circuit which creates and generates program voltage, a plurality of different intermediate voltages and bit line voltage from power supply voltage, a row decoder which is supplied with the program voltage and the plurality of different intermediate voltages generated from the booster circuit, selects at least one of the control gate lines and selectively activates first and second selection gate lines respectively connected to gates of the first and second selection gate transistors, a bit line control circuit which is supplied with the bit line voltage generated from the booster circuit and performs operations of latching program data and sensing data at the readout time, and a column decoder which selects a column of the memory cell units, wherein the row decoder applies high voltage among the plurality of different intermediate voltages to non-selected control gate lines when the position of the selected control gate line lies near the bit line and applies low voltage among the plurality of different intermediate voltages to the non-selected control gate lines when the position of the selected control gate line is far away from the bit line.

A nonvolatile semiconductor memory device according to another aspect of the present invention comprises a memory cell array having a plurality of memory cell blocks arranged in a column direction and control gate lines provided for each of the plurality of memory cell blocks, each of the memory cell blocks including a plurality of memory cell units arranged in a row direction and each connected to the control gate lines, each of the plurality of memory cell units including a plurality of electrically data programmable and erasable memory transistors which are arranged in the column direction and whose current paths are serially connected, a first selection gate transistor having a current path connected at one end to one end of a current path of the series-connected memory transistors and connected at the other end to a bit line, and a second selection gate transistor having a current path connected at one end to the other end of the current path of the series-connected memory transistors and connected at the other end to a source line, and each of the control gate lines being commonly connected to control gates of those of the memory transistors which are arranged on a corresponding one of rows in the memory cell units of each of the memory cell blocks, a booster circuit which creates and generates program voltage, intermediate voltage and bit line voltage from power supply voltage, a row decoder which is supplied with the program voltage and intermediate voltage generated from the booster circuit, selects at least one of the control gate lines and selectively activates first and second selection gate lines respectively connected to gates of the first and second selection gate transistors, a bit line control circuit which is supplied with the bit line voltage generated from the booster circuit and performs operations of latching program data and sensing data at the readout time, and a column decoder which selects a column of the memory cell units, wherein the row decoder applies reference voltage which cuts off the memory transistor to at least one non-selected control gate line lying near the bit line and applies the intermediate voltage to at least one non-selected control gate line lying far away from the bit line when the position of the selected control gate line lies near the bit line and applies the intermediate voltage to the non-selected control gate lines when the position of the selected control gate line is far away from the bit line.

A nonvolatile semiconductor memory device according to still another aspect of the present invention comprises a memory cell array having a plurality of memory cell blocks arranged in a column direction and control gate lines provided for each of the plurality of memory cell blocks, each of the memory cell blocks including a plurality of memory cell units arranged in a row direction and each connected to the control gate lines, each of the plurality of memory cell units including a plurality of electrically data programmable and erasable memory transistors which are arranged in the column direction and whose current paths are serially connected, a first selection gate transistor having a current path connected at one end to one end of a current path of the series-connected memory transistors and connected at the other end to a bit line, and a second selection gate transistor having a current path connected at one end to the other end of the current path of the series-connected memory transistors and connected at the other end to a source line, and each of the control gate lines being commonly connected to control gates of those of the memory transistors which are arranged on a corresponding one of rows in the memory cell units of each of the memory cell blocks, a booster circuit which creates and generates program voltage, a plurality of different intermediate voltages and bit line voltage from power supply voltage, a row decoder which is supplied with the program voltage and the plurality of different intermediate voltages generated from the booster circuit, selects at least one of the control gate lines and selectively activates first and second selection gate lines respectively connected to gates of the first and second selection gate transistors, a bit line control circuit which is supplied with the bit line voltage generated from the booster circuit and performs operations of latching program data and sensing data at the readout time, and a column decoder which selects a column of the memory cell units, wherein the row decoder applies high voltage among the plurality of different intermediate voltages to those of non-selected control gate lines which lie on the bit line side and applies low voltage among the plurality of different intermediate voltages to those of the non-selected control gate lines which lie on the source line side at the data programming time.

BRIEF DESCRIPTION OF THE SEVERAL VIEWS OF THE DRAWING

FIG. 1A is an equivalent circuit diagram showing a bias state in a self-boost system, for illustrating the conventional nonvolatile semiconductor memory device;

FIG. 1B is a cross sectional view showing a state in which the voltage of a channel region is boosted at the "1" programming time in the self-boost system, for illustrating the conventional nonvolatile semiconductor memory device;

FIG. 14A is an equivalent circuit diagram showing a bias state at the time of data programming into a memory transistor connected to the nth control gate line from the bit line side, for illustrating a nonvolatile semiconductor memory device according to a seventh embodiment of the present invention;

FIG. 14B is an equivalent circuit diagram showing a bias state at the time of data programming into a memory transistor connected to the kth control gate line from the bit line side, for illustrating the nonvolatile semiconductor memory device according to the seventh embodiment of the present invention;

FIG. 14C is an equivalent circuit diagram showing a bias state at the time of data programming into a memory transistor connected to the first control gate line from the bit line side, for illustrating the nonvolatile semiconductor memory device according to the seventh embodiment of the present invention;

FIG. 20 is a block diagram showing an extracted main portion of a nonvolatile semiconductor memory device according to a thirteenth embodiment of the present invention, for illustrating the nonvolatile semiconductor memory device;

FIG. 23A is an equivalent circuit diagram showing a bias state at the time of data programming into a memory transistor connected to the nth control gate line from the bit line side, for illustrating a nonvolatile semiconductor memory device according to a fourteenth embodiment of the present invention;

FIG. 23B is an equivalent circuit diagram showing a bias state at the time of data programming into a memory transistor connected to the kth control gate line from the bit line side, for illustrating the nonvolatile semiconductor memory device according to the fourteenth embodiment of the present invention;

FIG. 23C is an equivalent circuit diagram showing a bias state at the time of data programming into a memory transistor connected to the first control gate line from the bit line side, for illustrating the nonvolatile semiconductor memory device according to the fourteenth embodiment of the present invention;

DETAILED DESCRIPTION OF THE INVENTION

In the first to seventeenth embodiments of the present invention, roughly divided three types of approach methods are proposed and used in combination to attain the most fruitful effect. Two of the above three types of approach methods are to reduce Vpass stress. That is, a plurality of (for example, two) intermediate voltages Vpass are used at the time of simultaneous programming. For example, since a memory transistor which lies on the bit line side with respect to a selected memory transistor is always kept in the erased state in sequential programming, low intermediate voltage is applied to the above memory transistor and high intermediate voltage is applied to a memory transistor on the source line side. It is considered that the Vpgm stress is not greatly increased even when the intermediate voltage Vpass is lowered since the boost effect of the memory transistor in the erased state is significant. Therefore, the effect of a reduction in the Vpass stress becomes more significant and erroneous programming can be suppressed as a whole.

The other approach method is to switch the Vpass voltage with much attention paid to the dependency of the Vpgm stress on the position of a word line used for programming. That is, the amplitude of the intermediate voltage Vpass is changed according to the position of a selected control gate line. Based on the detail measurement of erroneous programming, it is understood that the magnitude of Vpgm stress depends on the position of a memory transistor in the NAND cell unit when the sequential programming method is used. Therefore, the total Vpass stress can be reduced by using high voltage Vpass in a case where data is programmed into a memory transistor in which large Vpgm stress occurs and which requires high channel voltage and lowering the voltage Vpass in the other case.

The third approach method is to switch a channel voltage control system with much attention paid to the dependency of the Vpgm stress on the position of a word line used for programming (or the position of a memory transistor in the NAND cell unit). For example, only in the case of data programming of a word line which requires the channel voltage to be boosted to high voltage, the Vpgm stress is reduced by use of the LSB or EASB system.

Further, by combining the above methods, the effect of a further reduction in the stress can be expected.

Next, the embodiments are explained in detail with reference to FIGS. 5 to 26C.

First Embodiment

Figure 5:
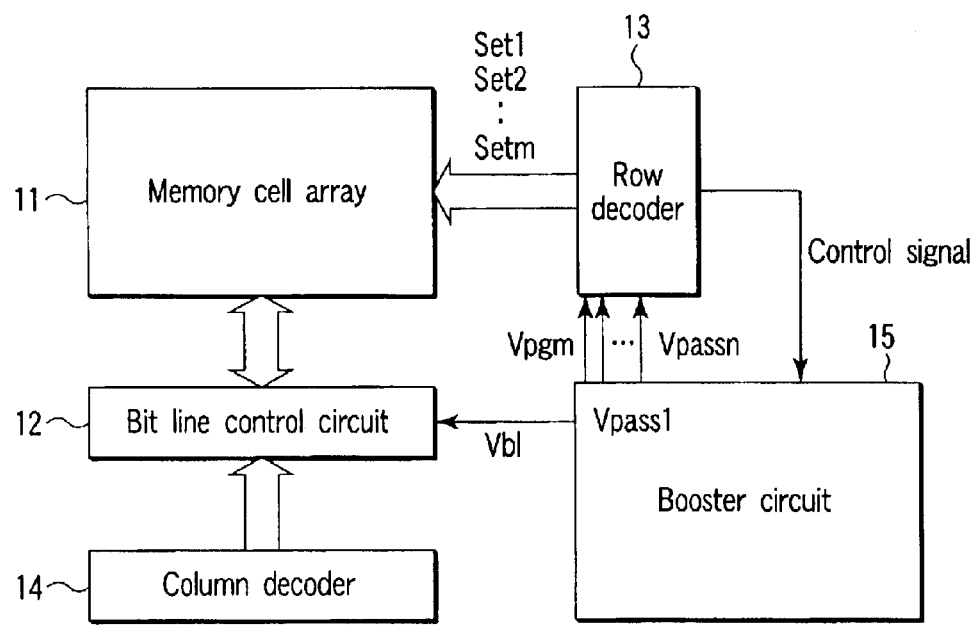
FIG. 5 is a block diagram showing an extracted main portion of a nonvolatile semiconductor memory device according to a first embodiment of the present invention, for illustrating the nonvolatile semiconductor memory device.

FIG. 5 is a block diagram showing an extracted main portion of a nonvolatile semiconductor memory device according to a first embodiment of the present invention, for illustrating the nonvolatile semiconductor memory device. In a memory cell array 11, NAND cell units are arranged in row and column directions in a matrix form, and control gate lines, bit lines, selection gate lines, source lines and the like are wired. A bit line control circuit 12 and row decoder 13 are connected to the memory cell array 11. The bit line control circuit 12 performs operations of latching program data, sensing data at the readout time and the like. A column decoder 14 which decodes a column address signal to select a column of the NAND cell units is connected to the bit line control circuit 12. A booster circuit 15 creates and generates program voltage Vpgm, a plurality of different intermediate voltages Vpass1 to Vpassn and bit line voltage Vbl from the power supply voltage. The row decoder 13 supplies a control signal to the booster circuit 15 and is supplied with the program voltage Vpgm and intermediate voltages Vpass1 to Vpassn. The row decoder 13 decodes a row address signal and outputs decode signals (voltage set) Set1, Set2, ... Setm of various voltages which are used to selectively activate memory transistors in the memory cell array 11 based on the voltage supplied from the booster circuit 15. Thus, the control gate line and selection gate line in the memory cell array 11 are selected. Further, the bit line control circuit 12 receives the bit line voltage Vbl from the booster circuit 15 and supplies the voltage to the column of the NAND cell unit which is selected by the column decoder 14.

In FIG. 5, only the circuits required for explaining the embodiment are shown. It should be noted that an address buffer, data input/output buffer, timing generator circuit and the like are omitted although they are additionally required.

In the case of programming, voltages such as the program voltage Vpgm, intermediate voltages Vpass1 to Vpassn and bit line voltage Vbl are created and generated from the power supply voltage in the booster circuit 15. The above voltages are applied to the control lines, selection gate lines and source line of the selected block via the row decoder 13 and data is programmed into a selected memory transistor. When attention is paid to voltages applied to the control gate lines, the program voltage Vpgm is applied to the selected control gate line and the types of voltages applied to the non-selected control gate lines and the way of applying the voltages to the non-selected control gate lines are changed according to the position of the selected control gate line in the block.

Figure 6:
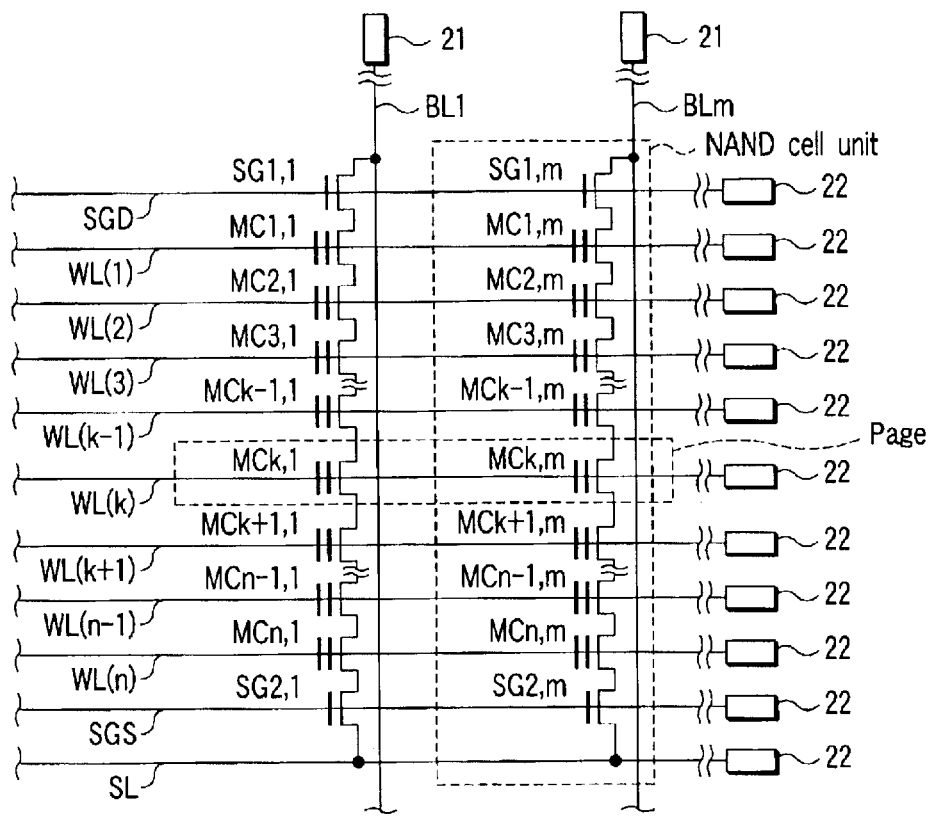
FIG. 6 is a circuit diagram showing an example of the configuration of a memory cell array (NAND memory cell array) in the circuit shown in FIG. 5.

FIG. 6 shows an example of the configuration of the memory cell array (NAND memory cell array) 11 in the circuit shown in FIG. 5. The memory transistor has a stacked gate structure in which a floating gate (charge storage layer) and control gate are stacked and formed above a semiconductor substrate with an insulating film disposed therebetween. The NAND cell unit is configured by serially connecting n memory transistors MC1,m to MCn,m while adjacent ones of the memory transistors commonly have a source or drain and respectively connecting selection gate transistors SG1,m, SG2,m to both ends of the series-connected memory transistor circuit. The NAND memory cell array 11 is configured by arranging the NAND cell units in a matrix form. A group of NAND cell units arranged on the same row is used as a NAND cell block. The drain of one selection gate transistor SG1,m of each NAND cell unit is connected to a corresponding bit line BLm and the source of the other selection gate transistor SG2,m is connected to a source line SL which is commonly used by a plurality of NAND cell units. The control gates of the selection gate transistors or a plurality of memory transistors which are arranged on the same row are commonly connected to a corresponding one of selection gate lines SGD, SGS or a corresponding one of control gate lines WL(k), respectively. All of the memory transistors connected to one control gate line are defined as a group of memory transistors into which data can be simultaneously programmed. The unit of data to be programmed is generally defined as one page. In recent years, a plurality of pages are allocated to one control gate line in some cases. If n memory transistors are provided in the NAND cell unit, the number of control gate lines contained in the memory cell block is n. A bit line driving circuit 21 drives the bit lines BL1 to BLm and a driving circuit 22 indicates a circuit which drives the control gate line WL(k), selection gate lines SGD, SGS and source line SL.

Figure 7A:
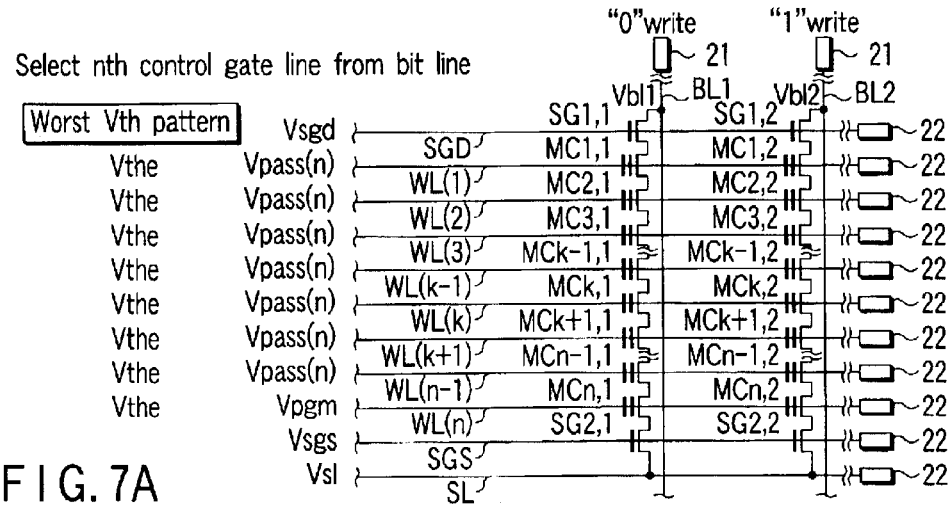
FIG. 7A is an equivalent circuit diagram showing a bias state at the time of data programming into a memory transistor connected to the nth control gate line from the bit line side, for illustrating the nonvolatile semiconductor memory device according to the first embodiment of the present invention.
Figure 7B:
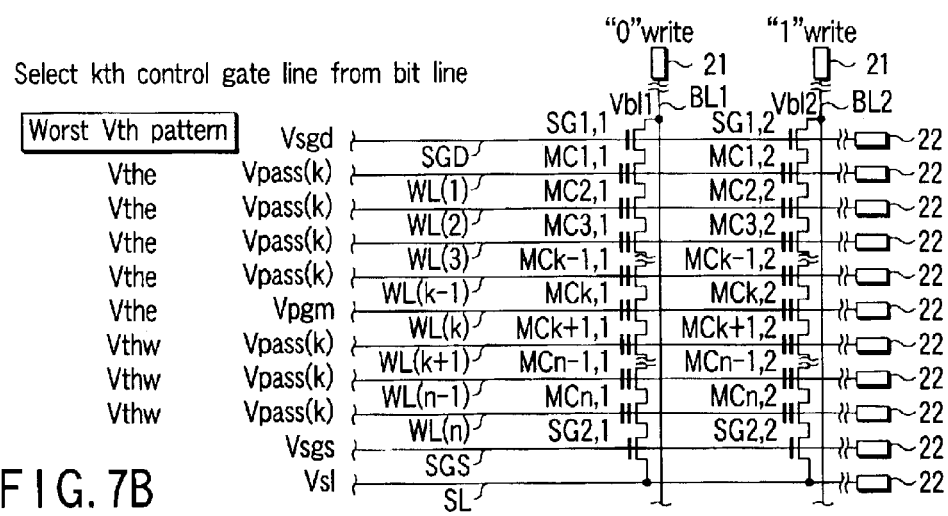
FIG. 7B is an equivalent circuit diagram showing a bias state at the time of data programming into a memory transistor connected to the kth control gate line from the bit line side, for illustrating the nonvolatile semiconductor memory device according to the first embodiment of the present invention.
Figure 7C:
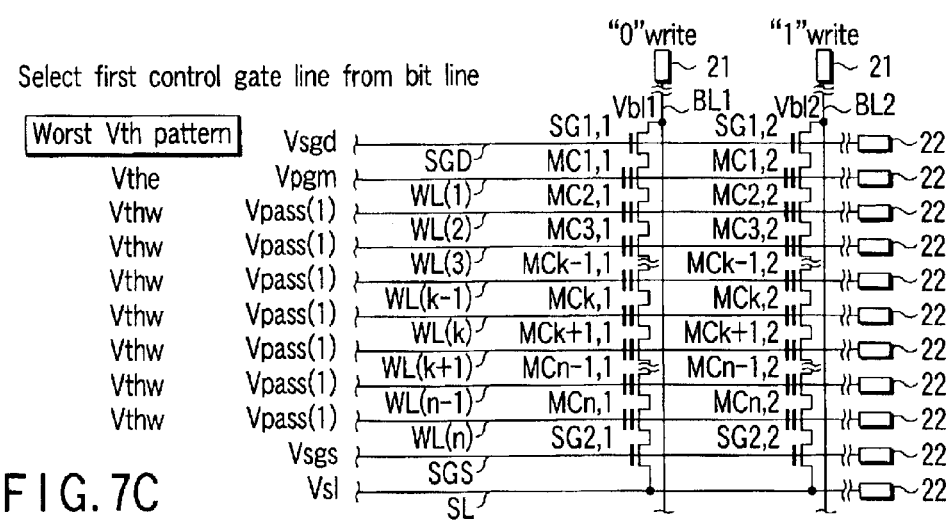
FIG. 7C is an equivalent circuit diagram showing a bias state at the time of data programming into a memory transistor connected to the first control gate line from the bit line side, for illustrating the nonvolatile semiconductor memory device according to the first embodiment of the present invention.

FIGS. 7A, 7B, 7C respectively show bias states at the time of data programming into memory transistors respectively connected to the nth, kth and first control gate lines from the bit line side. In the present embodiment, it is assumed that the programming process is a sequential programming process performed in order from the control gate line WL(n) on the source side to the control gate line WL(1) on the bit line side. The program voltage Vpgm is applied to a selected control gate line WL(k). Intermediate voltages Vpass(k) depending on k are applied to non-selected control gate lines other than the selected control gate line. That is, in the present embodiment, values (n values at maximum) of a plurality of different intermediate voltages Vpass are used depending on the position of the memory transistor in the NAND cell unit.

Next, the programming operation is explained with reference to FIGS. 7A, 7B, 7C. Sufficiently low voltage Vb11 (for example, 0V) is applied to the bit line BL1 coupled to a memory transistor into which "0" data is programmed and certain positive voltage Vb12 (for example, 1.2 to 4.0V) is applied to the bit line BL2 coupled to a memory transistor into which "1" data is programmed. The selection gate transistor SG1,1 on the bit line side is required to be turned ON in order to transfer the bit line voltage Vb11 in a NAND cell unit in which the "0" programming operation is performed. Further, the selection gate transistor SG1,2 on the bit line side must be automatically cut off at the channel voltage boosting time in a NAND cell unit in which the "1" programming operation is performed. That is, gate voltage Vsgd which satisfies a condition of $Vth\_sgd(0) < Vsgd < Vb12 + Vth\_sgd(Vb12)$ is applied to the selection gate line SGD on the bit line side. In this case, Vth_sgd indicates the threshold voltage of the selection gate transistor on the bit line side and the symbols in the parentheses indicate back bias voltage applied to the source of the selection gate transistor on the bit line side. Generally, as the voltage Vsgd, the same voltage (in this case, Vb12) as the bit line voltage used for "1" programming is given in many cases. Voltage Vsgs (for example, 0V) which cuts off the selection gate transistors on the source line side is applied to the selection gate line SGS on the source line side. The programming operation is simultaneously performed for all of the memory transistors connected to the selected control gate line after all of the memory transistors in the memory cell array or NAND cell block are simultaneously subjected to the erase operation. It is assumed that the programming operation is a sequential programming operation to sequentially program data in order from the first control gate line on the source line side to the control gate line on the bit line side.

Figure 8:
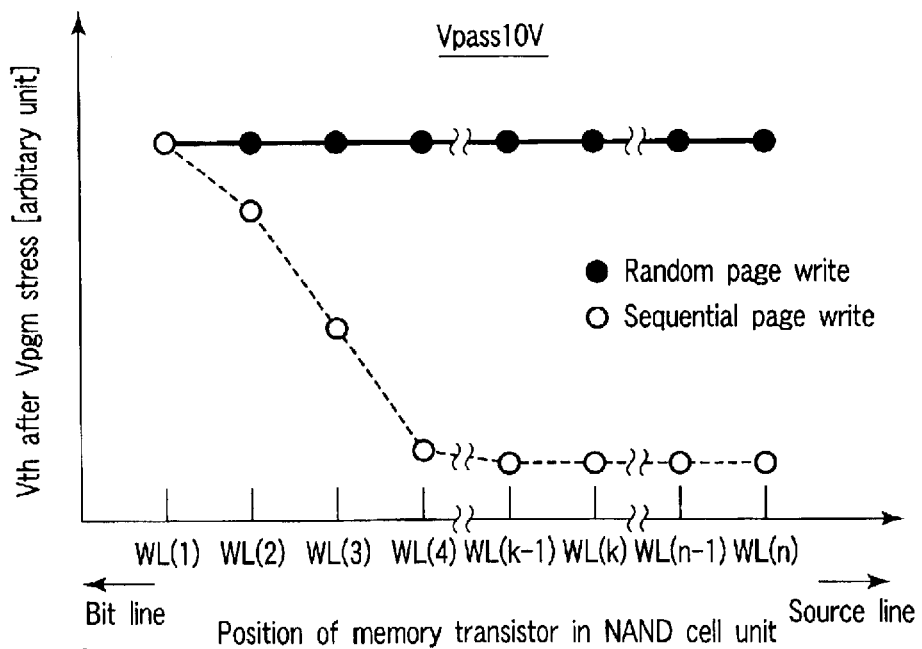
FIG. 8 is a characteristic diagram showing the dependency of Vpgm stress used in the self-boost system using sequential programming on the position of the memory transistors in the NAND cell unit.

FIG. 8 shows the dependency of Vpgm stress on the position of the memory transistor in the NAND cell unit in the case of sequential programming in comparison with that in the case of random programming. In this case, the threshold voltages of the memory transistor in the program state and erase state are respectively set to Vthw (>0) and Vthe (<0). Since the position of the threshold voltage in the erase state is not determined in the conventional case in which random programming is assumed, it is necessary to always consider a case wherein the threshold voltage of a selected memory transistor is Vthe and the threshold voltage of the other memory transistors is Vthw as the worst Vth pattern. Therefore, the Vpgm stress does not depend on the position of the memory transistor in the NAND cell unit and is constant (as shown by black dots in FIG. 8). However, since the memory transistor which lies on the bit line side with respect to the selected control gate line WL(k) is always kept in the erase state in the case of sequential programming, the worst Vth pattern for the Vpgm stress is obtained as shown in FIG. 7B in a case where the threshold voltage of the memory transistors MC1,2 to MCk,2 is Vthe and the threshold voltage of the memory transistors MCk+1,2 to MCn,2 is Vthw. Therefore, the number of erase threshold voltages Vthe in the worst Vth pattern in the case of simultaneous programming into each control gate line becomes larger as the corresponding memory transistor lies farther away from the bit line. In the equation (1), only one type of threshold voltage is assumed, but as is easily estimated from the equation (1), the channel voltage at the time of boosting increases as the number of erase threshold voltages increases. That is, the Vpgm stress becomes smaller for the memory transistor which lies farther away from the bit line (as shown by circles in FIG. 8). However, since the worst Vth pattern becomes the same as the worst Vth pattern obtained at the random programming time when "1" data is programmed into the first memory transistor from the bit line side, the Vpgm stress becomes the same as that obtained at this time.

In order to reduce the Vpgm stress, it is necessary to use high intermediate voltage Vpass. However, it is understood from FIG. 8 that only some memory transistors counted from the bit line side require the high intermediate voltage Vpass when sequential programming is assumed. Therefore, when the simultaneous programming operation is performed by use of the control gate lines which lie apart from the bit line, the intermediate voltage Vpass can be lowered without greatly increasing the Vpgm stress. That is, this means that the Vpass stress defined by the total sum of stresses occurring when all of the control gate lines are selected and used for programming can be lowered in comparison with that in the conventional case.

In the present embodiment, it is assumed that the number of intermediate voltages Vpass used is n at maximum (the number of memory transistors in the NAND cell unit), but it is not necessary to use different values for all of them. In practice, it is only required to provide the least sufficient number of intermediate voltages based on the dependency of the Vpgm stress on the position of the memory transistor in the NAND cell unit.

For example, when two types of intermediate voltages Vpass are used and if the selected control gate line is one of the third to fifth control gate lines which lie near the bit line, the high intermediate voltage Vpass is applied to all of the non-selected control gate lines. On the other hand, if the selected control gate line lies in position other than the above position, low intermediate voltage Vpass is applied to all of the non-selected control gate lines.

With the above configuration and programming method, the high intermediate voltage Vpass is selectively used depending on the position of a control gate line used for an area in which the Vpgm stress is large. As a result, the Vpass stress can be lowered and the reliability for program disturb can be enhanced.

Second Embodiment

A nonvolatile semiconductor memory device according to a second embodiment of this invention has basically the same configuration as that of the first embodiment and can be realized by modifying the row decoder 13 in the circuit of FIG. 5 to perform the selection operation as will be described below.

Figure 9A:
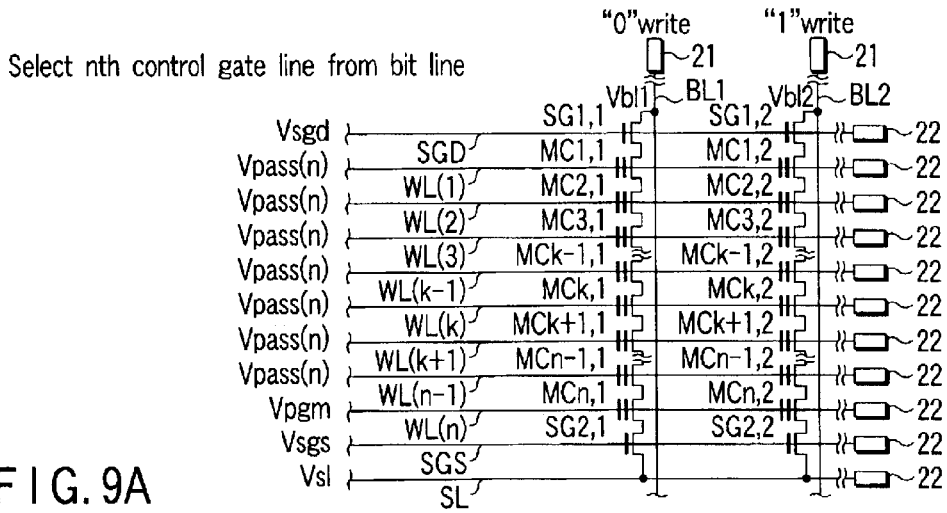
FIG. 9A is an equivalent circuit diagram showing a bias state at the time of data programming into a memory transistor connected to the nth control gate line from the bit line side, for illustrating a nonvolatile semiconductor memory device according to a second embodiment of the present invention.
Figure 9B:
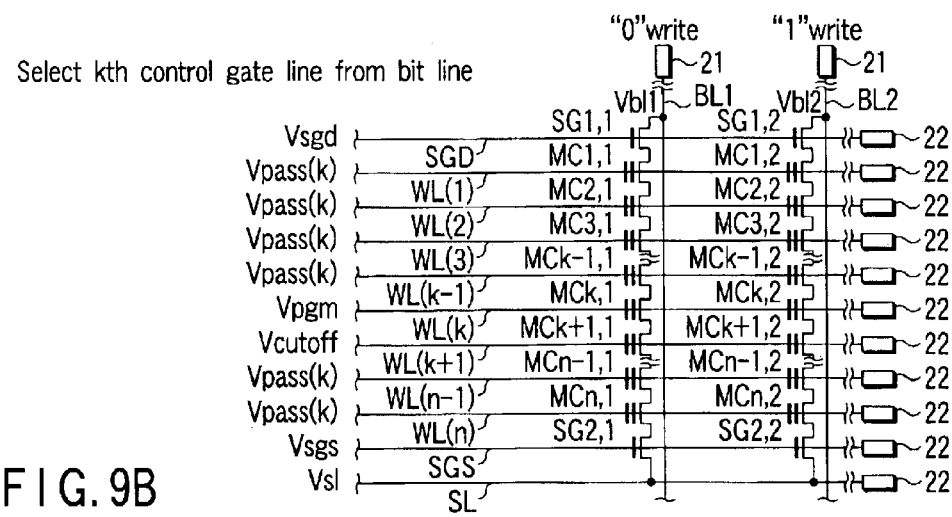
FIG. 9B is an equivalent circuit diagram showing a bias state at the time of data programming into a memory transistor connected to the kth control gate line from the bit line side, for illustrating the nonvolatile semiconductor memory device according to the second embodiment of the present invention.
Figure 9C:
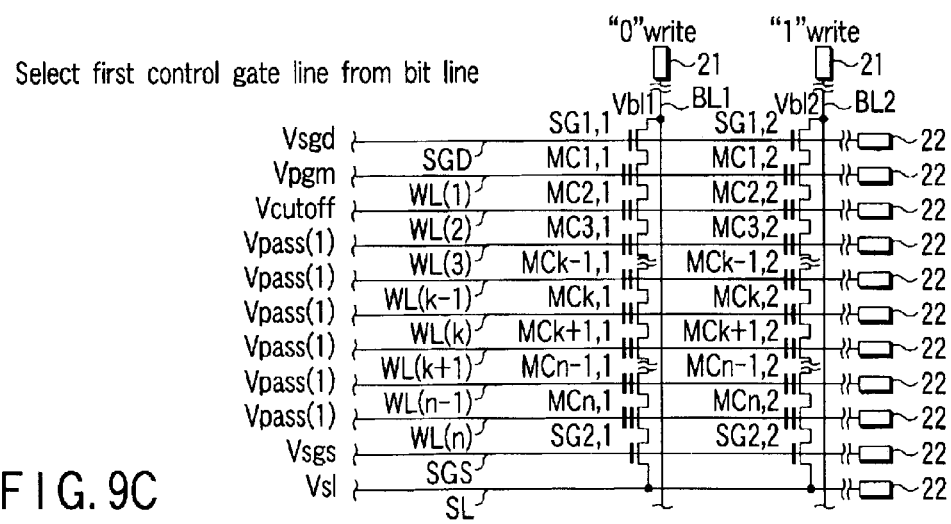
FIG. 9C is an equivalent circuit diagram showing a bias state at the time of data programming into a memory transistor connected to the first control gate line from the bit line side, for illustrating the nonvolatile semiconductor memory device according to the second embodiment of the present invention.

FIGS. 9A, 9B and 9C are equivalent circuit diagrams showing bias states at the time of data programming into memory transistors respectively connected to the nth, kth and first control gate lines from the bit line side. In the present embodiment, it is assumed that the programming process is a sequential programming process performed in order from the control gate line WL(n) on the source side to the control gate line WL(1) on the bit line side. Program voltage Vpgm is applied to a selected control gate line WL(k). Low voltage Vcutoff (for example, 0V) which cuts off the memory transistor is applied to the control gate line WL(k+1) which lies adjacent to and on the source line side of the selected control gate line WL(k). Intermediate voltage Vpass(k) is applied to non-selected control gate lines other than the above control gate lines. That is, in the present embodiment, different Vpass values (n values at maximum) are used depending on the position of the memory transistor in the NAND cell unit.

Since it is assumed that the sequential programming process is used in the EASB system, the dependency of the Vpgm stress on the position of the memory transistor in the NAND cell unit has the same tendency as that in the case of the SB system of sequential programming (circles in FIG. 8) although the absolute values of the stresses are different. That is, the Vpgm stress becomes smaller for the memory transistor which lies farther away from the bit line. Therefore, like the case of the first embodiment, when the programming operation is performed by use of the control gate line which lies apart from the bit line, the intermediate voltage Vpass can be lowered without greatly increasing the Vpgm stress. This means that the Vpass stress defined by the total sum of stresses occurring when all of the control gate lines are selected and used for programming can be lowered in comparison with that in the conventional case.

In the present embodiment, it is assumed that one memory transistor which is cut off is provided on the source line side of the selected memory transistor, but two or more memory transistors can be provided.

Further, in the present embodiment, it is assumed that the number of intermediate voltages Vpass used is n at maximum (the number of memory transistors in the NAND cell unit), but it is not necessary to use different values for all of them. In practice, it is only required to provide the least sufficient number of intermediate voltages based on the dependency of the Vpgm stress on the position of the memory transistor in the NAND cell unit.

Third Embodiment

A nonvolatile semiconductor memory device according to a third embodiment of this invention has basically the same configuration as that of the first embodiment and can be realized by modifying the row decoder 13 in the circuit of FIG. 5 to perform the selection operation as will be described below.

Figure 10A:
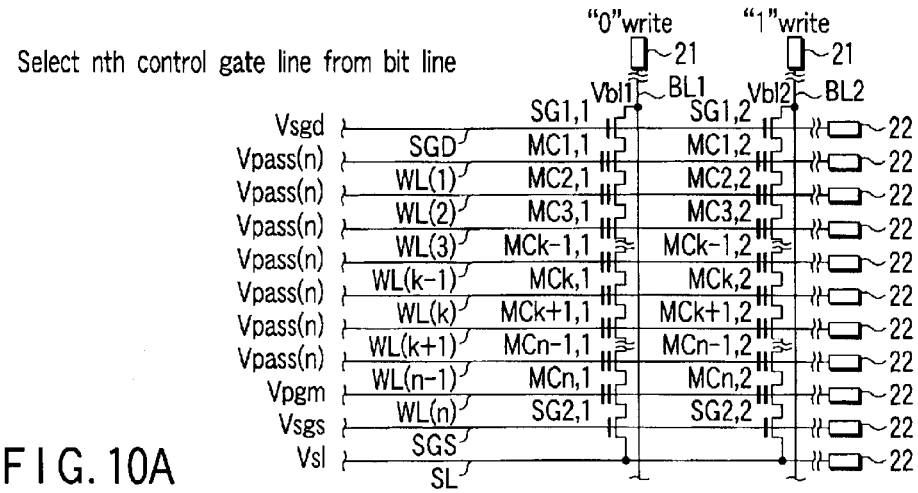
FIG. 10A is an equivalent circuit diagram showing a bias state at the time of data programming into a memory transistor connected to the nth control gate line from the bit line side, for illustrating a nonvolatile semiconductor memory device according to a third embodiment of the present invention.
Figure 10B:
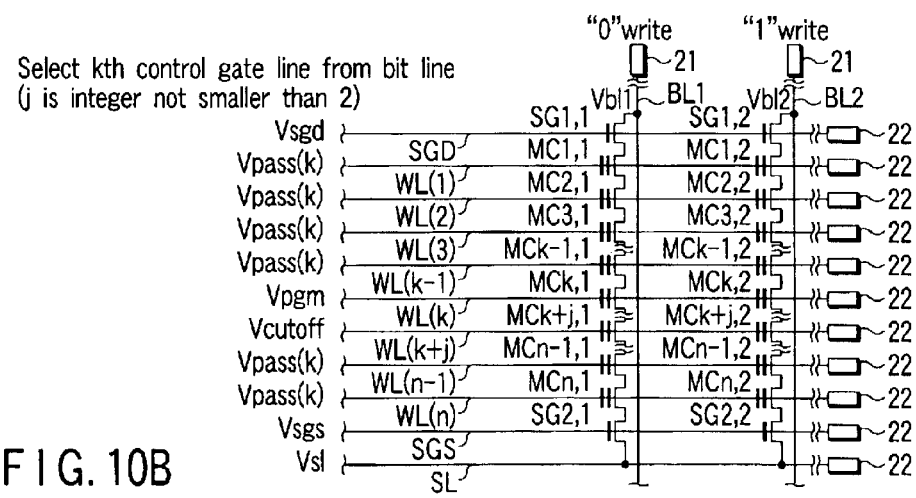
FIG. 10B is an equivalent circuit diagram showing a bias state at the time of data programming into a memory transistor connected to the kth control gate line from the bit line side, for illustrating the nonvolatile semiconductor memory device according to the third embodiment of the present invention.
Figure 10C:
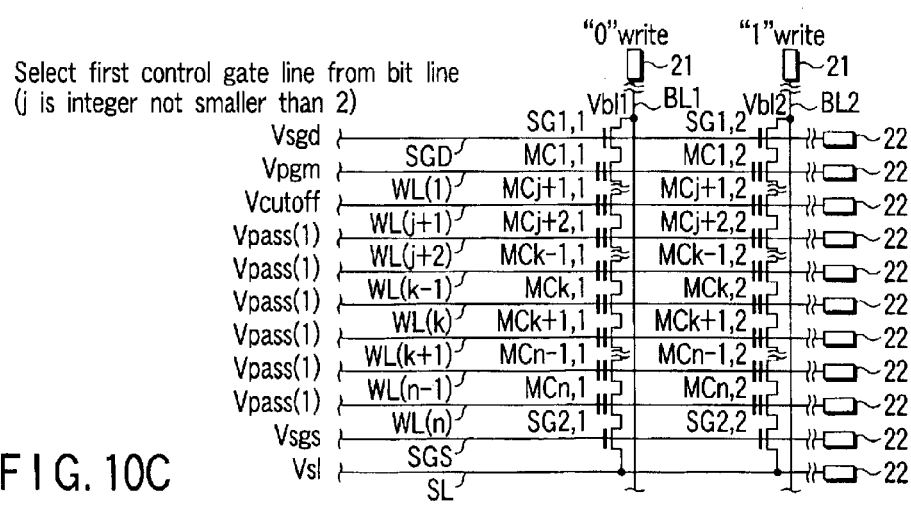
FIG. 10C is an equivalent circuit diagram showing a bias state at the time of data programming into a memory transistor connected to the first control gate line from the bit line side, for illustrating the nonvolatile semiconductor memory device according to the third embodiment of the present invention.

FIGS. 10A, 10B and 10C are equivalent circuit diagrams showing bias states at the time of data programming into memory transistors respectively connected to the nth, kth and first control gate lines from the bit line side. In the present embodiment, it is assumed that the programming process is a sequential programming process performed in order from a control gate line WL(n) on the source side to a control gate line WL(1) on the bit line side. Program voltage Vpgm is applied to a selected control gate line WL(k). Low voltage Vcutoff (for example, 0V) which cuts off the memory transistor is applied to a control gate line WL(k+j) (j is an integer equal to or larger than 2). Intermediate voltage Vpass(k) is applied to non-selected control gate lines other than the above control gate lines. That is, in the present embodiment, different Vpass values (n values at maximum) are used depending on the position of the memory transistor in the NAND cell unit.

The present embodiment is different from the second embodiment in the position of the memory transistor which is cut off. Keeping the non-selected control gate line to which low voltage Vcutoff is applied away from the selected control gate line to which program voltage Vpgm is applied is two important meanings. One is to prevent the high voltage Vpgm of the selected control gate line from being lowered by capacitive coupling between neighboring control gate lines. The other is to prevent the low voltage Vcutoff of the non-selected control gate line from being raised by capacitive coupling between neighboring control gate lines. These problems by capacitive coupling are obeserved in the conventional EASB system and are getting worse with shirinking a size of a memory transistor. This drawback of the EASB system can be solved by this new programming method.

In the present embodiment, it is assumed that one memory transistor which is cut off is provided on the source line side of the selected memory transistor, but two or more memory transistors can be provided.

Further, in the present embodiment, it is assumed that the number of intermediate voltages Vpass used is n at maximum (the number of memory transistors in the NAND cell unit), but it is not necessary to use different values for all of them. In practice, it is only required to provide the least sufficient number of intermediate voltages based on the dependency of the Vpgm stress on the position of the memory transistor in the NAND cell unit.

Fourth Embodiment

A nonvolatile semiconductor memory device according to a fourth embodiment of this invention has basically the same configuration as that of the first embodiment and can be realized by modifying the row decoder 13 in the circuit of FIG. 5 to perform the selection operation as will be described below.

Figure 2A:
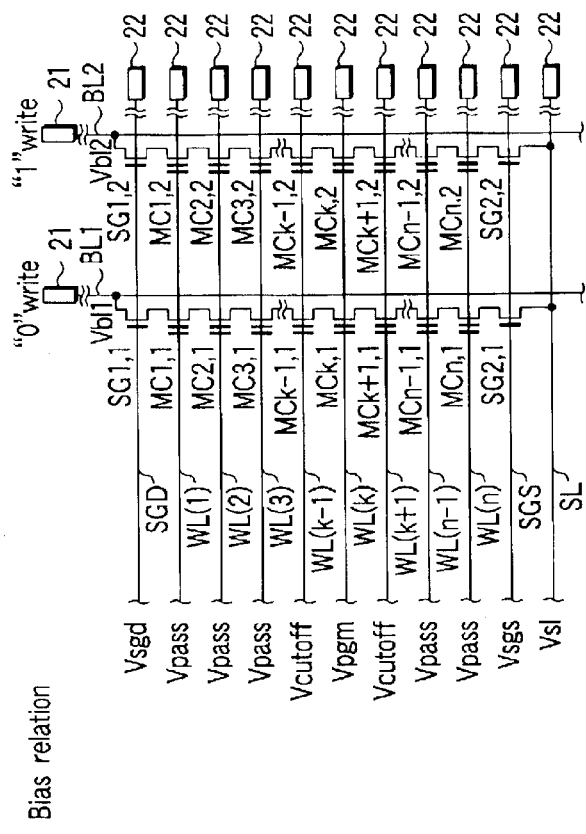
FIG. 2A is an equivalent circuit diagram showing a bias state in a local self-boost system, for illustrating the conventional nonvolatile semiconductor memory device.
Figure 2B:
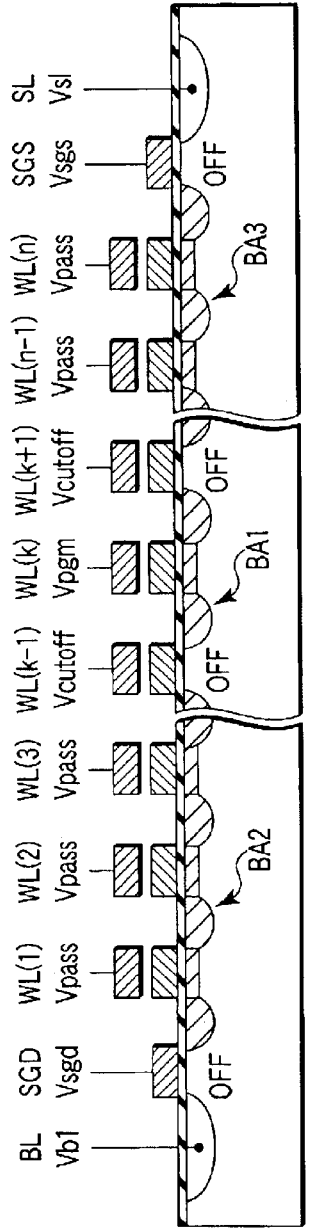
FIG. 2B is a cross sectional view showing a state in which the voltage of a channel region is boosted at the "1" programming time in the local self-boost system, for illustrating the conventional nonvolatile semiconductor memory device.
Figure 3A:
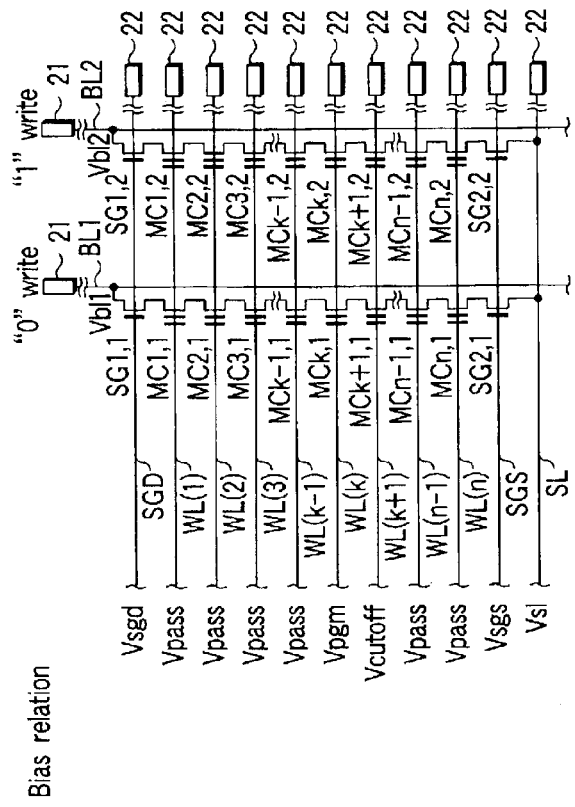
FIG. 3A is an equivalent circuit diagram showing a bias state in an erased area self-boost system, for illustrating the conventional nonvolatile semiconductor memory device.
Figure 3B:
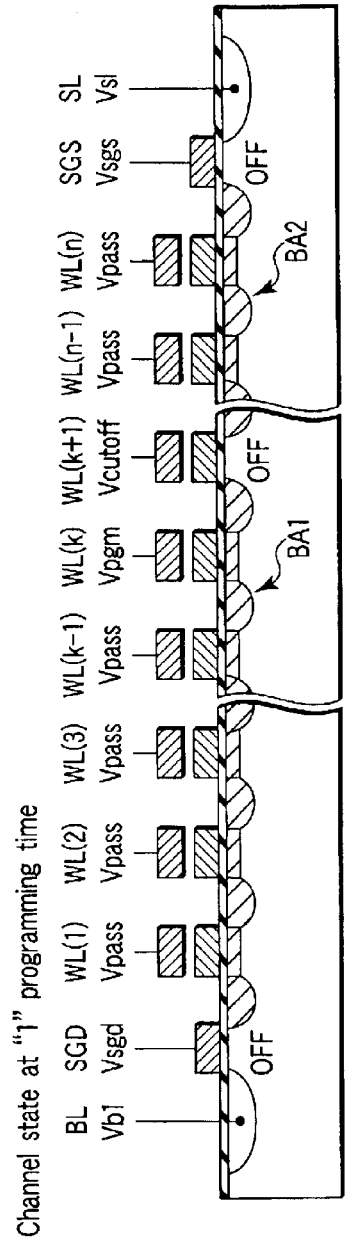
FIG. 3B is a cross sectional view showing a state in which the voltage of a channel region is boosted at the "1" programming time in the erased area self-boost system, for illustrating the conventional nonvolatile semiconductor memory device.
Figure 11A:
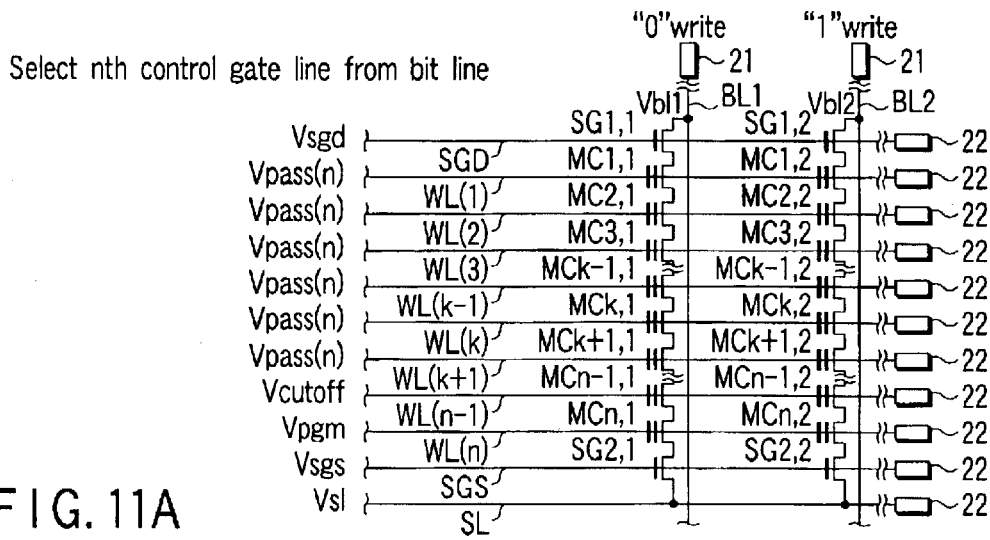
FIG. 11A is an equivalent circuit diagram showing a bias state at the time of data programming into a memory transistor connected to the nth control gate line from the bit line side, for illustrating a nonvolatile semiconductor memory device according to a fourth embodiment of the present invention.
Figure 11B:
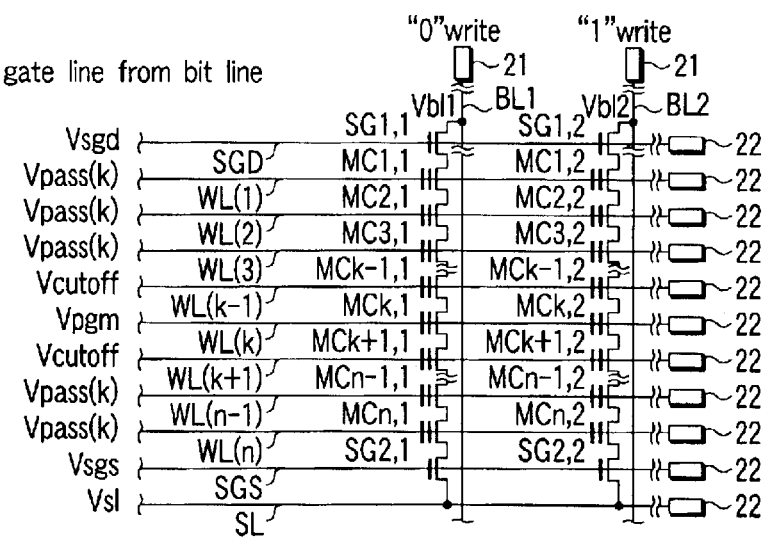
FIG. 11B is an equivalent circuit diagram showing a bias state at the time of data programming into a memory transistor connected to the kth control gate line from the bit line side, for illustrating the nonvolatile semiconductor memory device according to the fourth embodiment of the present invention.
Figure 11C:
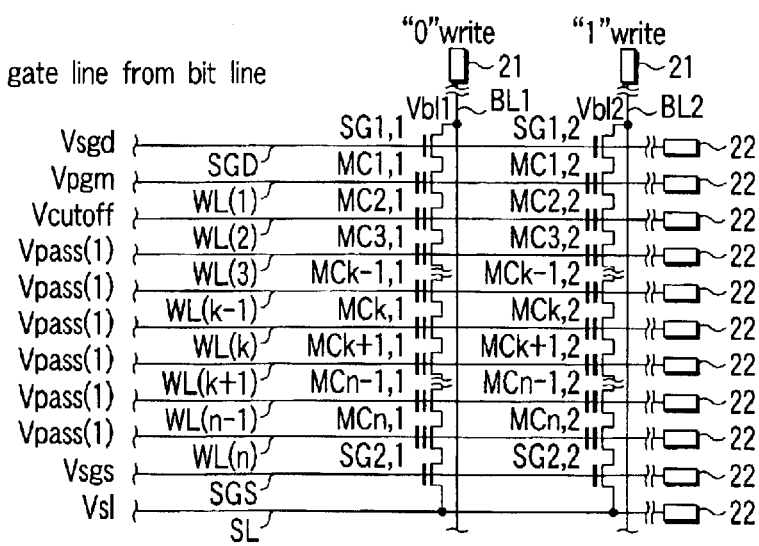
FIG. 11C is an equivalent circuit diagram showing a bias state at the time of data programming into a memory transistor connected to the first control gate line from the bit line side, for illustrating the nonvolatile semiconductor memory device according to the fourth embodiment of the present invention.

FIGS. 11A, 11B and 11C are equivalent circuit diagrams showing bias states at the time of data programming into memory transistors respectively connected to the nth, kth and first control gate lines from the bit line side. In the present embodiment, it is assumed that the programming process is a sequential programming process performed in order from a control gate line WL(n) on the source side to a control gate line WL(1) on the bit line side. Program voltage Vpgm is applied to a selected control gate line WL(k). Low voltage Vcutoff (for example, 0V) which cuts off the memory transistor is applied to control gate lines WL(k−1), WL(k+1) lying on both sides of the selected control gate line WL(k). Intermediate voltage Vpass(k) is applied to non-selected control gate lines other than the above control gate lines. That is, in the present embodiment, different Vpass values (n values at maximum) are used depending on the position of the memory transistor in the NAND cell unit. In the conventional LSB system shown in FIG. 2, only one type of Vpass is used as the intermediate voltage and it is different from the present embodiment in this point.

Since it is assumed that the sequential programming process is used in the LSB system, the dependency of the Vpgm stress on the position of the memory transistor in the NAND cell unit has the same tendency as that in the case of the SB system of sequential programming (circles in FIG. 8) although the absolute values of the stresses are different. That is, the Vpgm stress becomes smaller for the memory transistor which lies farther away from the bit line. Therefore, like the case of the first embodiment, when the programming operation is performed by use of the control gate line which lies apart from the bit line, the intermediate voltage Vpass can be lowered without greatly increasing the Vpgm stress. This means that the Vpass stress defined by the total sum of stresses occurring when all of the control gate lines are selected and used for programming can be lowered in comparison with that in the conventional case.

In the present embodiment, it is assumed that one memory transistor which is cut off is provided on each of the bit line side and source line side of the selected memory transistor, but two or more memory transistors can be provided on each side.

Further, in the present embodiment, it is assumed that the number of intermediate voltages Vpass used is n at maximum (the number of memory transistors in the NAND cell unit), but it is not necessary to use different values for all of them. In practice, it is only required to provide the least sufficient number of intermediate voltages based on the dependency of the Vpgm stress on the position of the memory transistor in the NAND cell unit.

Fifth Embodiment

A nonvolatile semiconductor memory device according to a fifth embodiment of this invention has basically the same configuration as that of the first embodiment and can be realized by modifying the row decoder 13 in the circuit of FIG. 5 to perform the selection operation as will be described below.

Figure 12A:
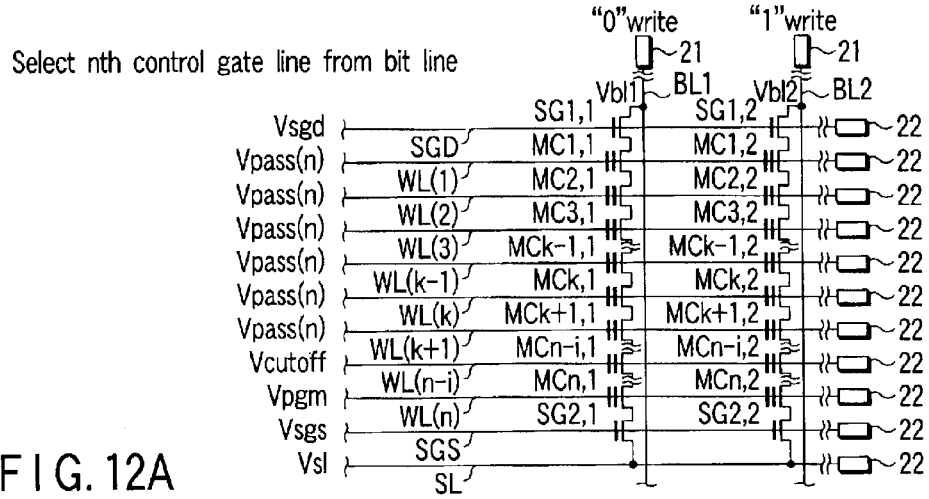
FIG. 12A is an equivalent circuit diagram showing a bias state at the time of data programming into a memory transistor connected to the nth control gate line from the bit line side, for illustrating a nonvolatile semiconductor memory device according to a fifth embodiment of the present invention.
Figure 12B:
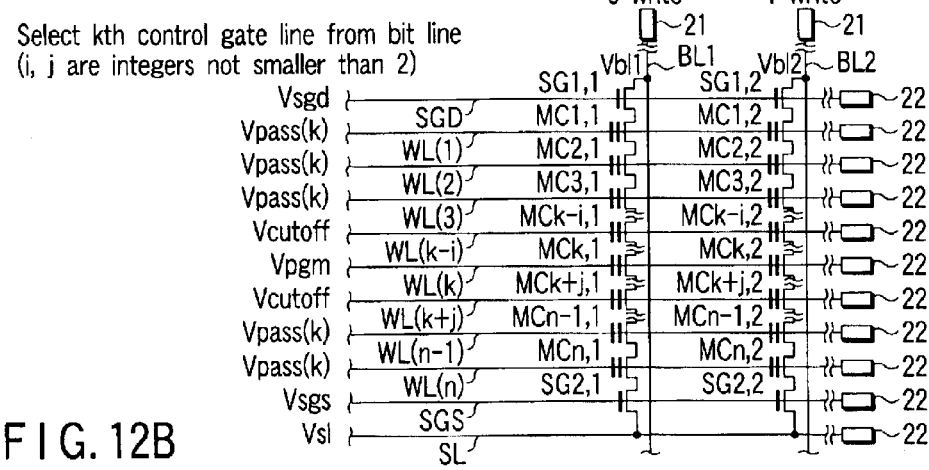
FIG. 12B is an equivalent circuit diagram showing a bias state at the time of data programming into a memory transistor connected to the kth control gate line from the bit line side, for illustrating the nonvolatile semiconductor memory device according to the fifth embodiment of the present invention.
Figure 12C:
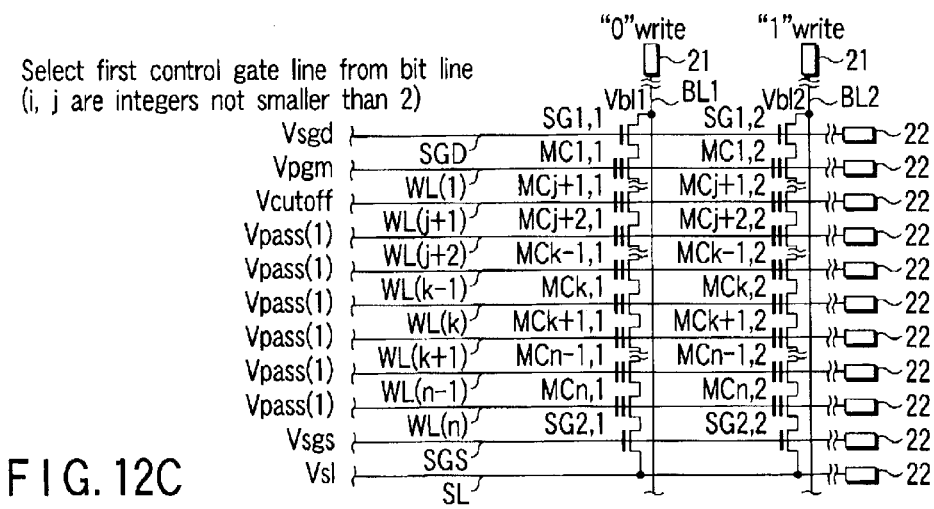
FIG. 12C is an equivalent circuit diagram showing a bias state at the time of data programming into a memory transistor connected to the first control gate line from the bit line side, for illustrating the nonvolatile semiconductor memory device according to the fifth embodiment of the present invention.

FIGS. 12A, 12B and 12C are equivalent circuit diagrams showing bias states at the time of data programming into memory transistors respectively connected to the nth, kth and first control gate lines from the bit line side. In the present embodiment, it is assumed that the programming process is a sequential programming process performed in order from a control gate line WL(n) on the source side to a control gate line WL(1) on the bit line side. Program voltage Vpgm is applied to a selected control gate line WL(k). Low voltage Vcutoff (for example, 0V) which cuts off the memory transistor is applied to control gate lines WL(k−i), WL(k+j) (i and j are integers equal to or larger than 2). Intermediate voltage Vpass(k) is applied to non-selected control gate lines other than the above control gate lines. That is, in the present embodiment, different Vpass values (n values at maximum) are used depending on the position of the memory transistor in the NAND cell unit. In the conventional LSB system shown in FIG. 2, only one type of Vpass is used as the intermediate voltage and it is different from the present embodiment in this point.

In the present embodiment, the position of the memory transistor to be cut off is different from that in the case of the fourth embodiment.

In the present embodiment, it is assumed that one memory transistor to be cut off is provided on each of the bit line side and source line side of the selected memory transistor, but two or more memory transistors can be provided on each side.

Further, in the present embodiment, it is assumed that the number of intermediate voltages Vpass used is n at maximum (the number of memory transistors in the NAND cell unit), but it is not necessary to use different values for all of them. In practice, it is only required to provide the least sufficient number of intermediate voltages based on the dependency of the Vpgm stress on the position of the memory transistor in the NAND cell unit.

Sixth Embodiment

A nonvolatile semiconductor memory device according to a sixth embodiment of this invention has basically the same configuration as that of the first embodiment and can be realized by modifying the row decoder 13 in the circuit of FIG. 5 to perform the selection operation as will be described below.

Figure 13A:
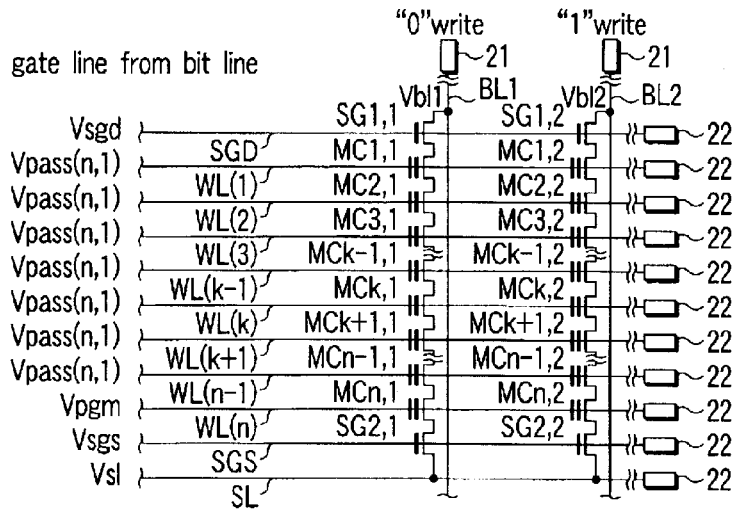
FIG. 13A is an equivalent circuit diagram showing a bias state at the time of data programming into a memory transistor connected to the nth control gate line from the bit line side, for illustrating a nonvolatile semiconductor memory device according to a sixth embodiment of the present invention.
Figure 13B:
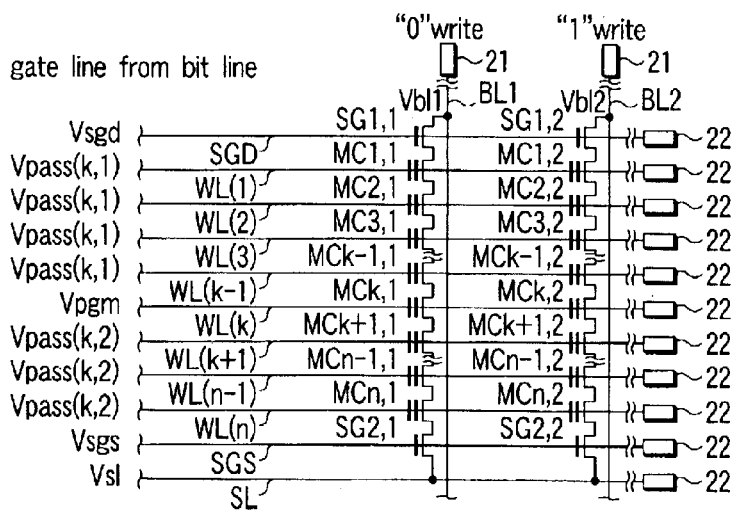
FIG. 13B is an equivalent circuit diagram showing a bias state at the time of data programming into a memory transistor connected to the kth control gate line from the bit line side, for illustrating the nonvolatile semiconductor memory device according to the sixth embodiment of the present invention.
Figure 13C:
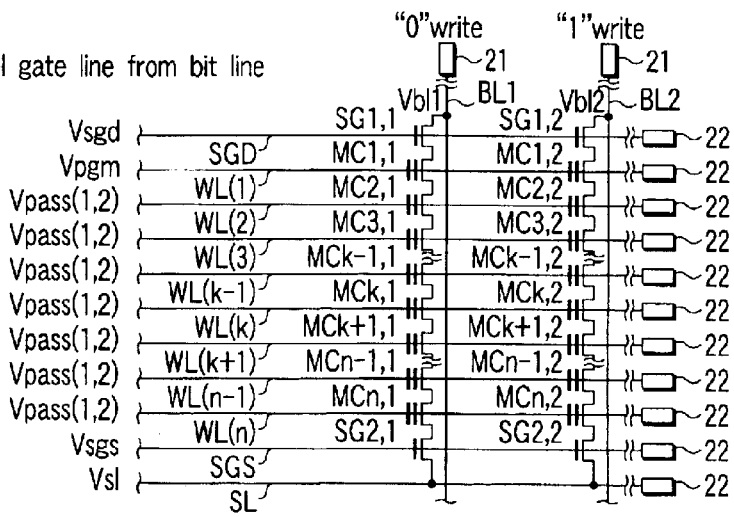
FIG. 13C is an equivalent circuit diagram showing a bias state at the time of data programming into a memory transistor connected to the first control gate line from the bit line side, for illustrating the nonvolatile semiconductor memory device according to the sixth embodiment of the present invention.

FIGS. 13A, 13B and 13C are equivalent circuit diagrams showing bias states at the time of data programming into memory transistors respectively connected to the nth, kth and first control gate lines from the bit line side. In the present embodiment, it is assumed that the programming process is a sequential programming process performed in order from a control gate line WL(n) on the source side to a control gate line WL(1) on the bit line side. A case wherein the kth control gate line from the bit line side is used for programming (FIG. 13B) is explained as an example. Program voltage Vpgm is applied to a selected control gate line WL(k). Intermediate voltage Vpass(k,1) is applied to control gate lines WL(1) to WL(k−1) between the selected control gate line WL(k) and a selection gate line SGD on the bit line side. Further, intermediate voltage Vpass(k,2) higher than Vpass(k,1) is applied to control gate lines WL(k+1) to WL(n) between the selected control gate line WL(k) and a selection gate line SGS on the source line side (Vpass(k,1) <Vpass(k,2)). In the present embodiment, two types of intermediate voltages Vpass are used in the simultaneous programming process with respect to the control gate lines and the Vpass values are changed for the control gate lines in the respective bias states. Therefore, 2n types of intermediate voltages Vpass at maximum are used. In the conventional case, only one type of Vpass is used as the intermediate voltage and it is basically different from the present embodiment in this point.

Thus, the total erroneous programming stress can be reduced by setting the intermediate voltage Vpass to more finely optimized values.

In this example, it is assumed that 2n types of intermediate voltages Vpass at maximum are used, but it is not necessary to use different values for all of them. It is only required to provide the least sufficient number of intermediate voltages based on the effect of the erroneous programming characteristic.

Seventh Embodiment

A nonvolatile semiconductor memory device according to a seventh embodiment of this invention has basically the same configuration as that of the first embodiment and can be realized by modifying the row decoder 13 in the circuit of FIG. 5 to perform the selection operation as will be described below.

FIGS. 14A, 14B and 14C are equivalent circuit diagrams showing bias states at the time of data programming into memory transistors respectively connected to the nth, kth and first control gate lines from the bit line side. In the present embodiment, it is assumed that the programming process is a sequential programming process performed in order from a control gate line WL(n) on the source side to a control gate line WL(1) on the bit line side. A case wherein the kth control gate line from the bit line side is used for programming (FIG. 14B) is explained as an example. Program voltage Vpgm is applied to a selected control gate line WL(k). Low voltage Vcutoff (for example, 0V) which cuts off the memory transistor is applied to a control gate line WL(k+j) (j is an integer equal to or larger than 2). Intermediate voltage Vpass(k,1) is applied to non-selected control gate lines which lie on the bit line side with respect to the selected control gate line and are different from the above control gate lines. Further, intermediate voltage Vpass(k,2) higher than Vpass(k,1) is applied to non-selected control gate lines which lie on the source line side with respect to the selected control gate line and are different from the above control gate lines (Vpass(k,1)<Vpass(k,2)).

In the present embodiment, two types of intermediate voltages Vpass are used in the simultaneous programming process with respect to the control gate lines and the Vpass values are changed for the control gate lines in the respective bias states. Therefore, 2n types of intermediate voltages Vpass at maximum are used. In the conventional case, only one type of Vpass is used as the intermediate voltage and it is basically different from the present embodiment in this point.

In the present embodiment, it is assumed that one memory transistor to be cut off is provided on the source line side of the selected memory transistor and it is different from the seventh embodiment in this point. Two or more memory transistors to be cut off can be provided.

Thus, the total erroneous programming stress can be reduced by setting the intermediate voltage Vpass to more finely optimized values.

In this example, it is assumed that 2n types of intermediate voltages Vpass at maximum are used, but it is not necessary to use different values for all of them. It is only required to provide the least sufficient number of intermediate voltages according to the effect of the erroneous programming characteristic.

Eighth Embodiment

A nonvolatile semiconductor memory device according to an eighth embodiment of this invention has basically the same configuration as that of the first embodiment and can be realized by modifying the row decoder 13 in the circuit of FIG. 5 to perform the selection operation as will be described below.

Figure 15A:
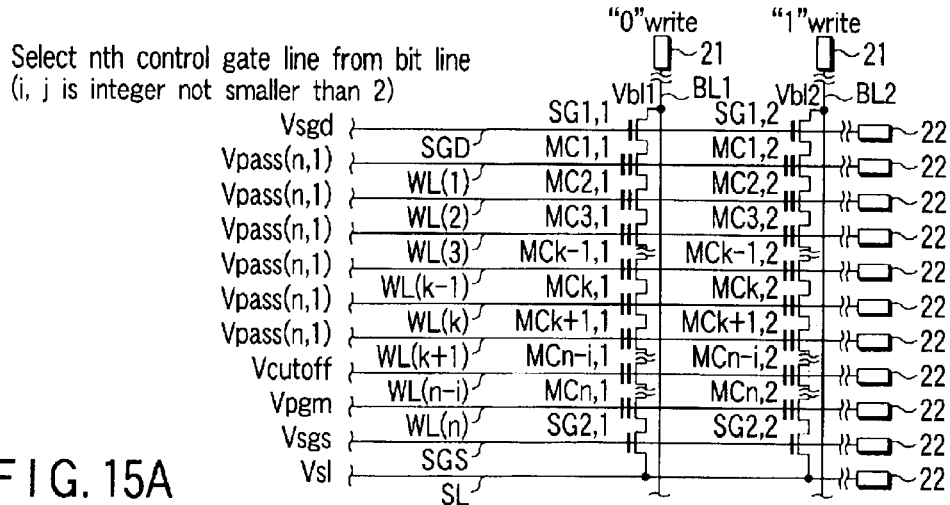
FIG. 15A is an equivalent circuit diagram showing a bias state at the time of data programming into a memory transistor connected to the nth control gate line from the bit line side, for illustrating a nonvolatile semiconductor memory device according to an eighth embodiment of the present invention.
Figure 15B:
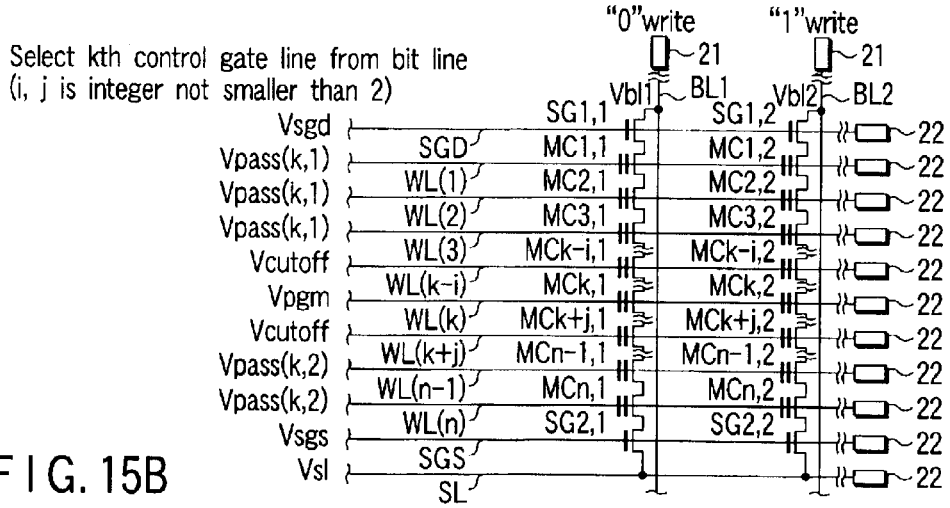
FIG. 15B is an equivalent circuit diagram showing a bias state at the time of data programming into a memory transistor connected to the kth control gate line from the bit line side, for illustrating the nonvolatile semiconductor memory device according to the eighth embodiment of the present invention.
Figure 15C:
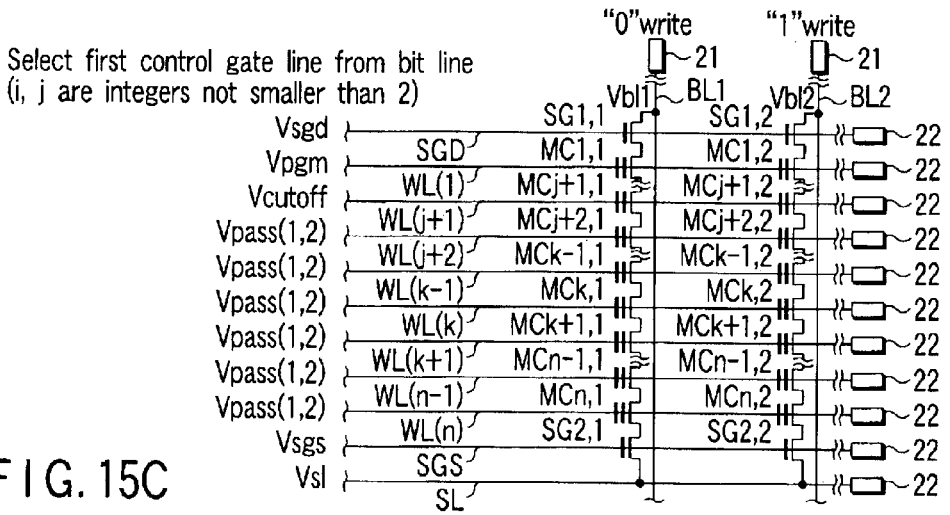
FIG. 15C is an equivalent circuit diagram showing a bias state at the time of data programming into a memory transistor connected to the first control gate line from the bit line side, for illustrating the nonvolatile semiconductor memory device according to the eighth embodiment of the present invention.

FIGS. 15A, 15B and 15C are equivalent circuit diagrams showing bias states at the time of data programming into memory transistors respectively connected to the nth, kth and first control gate lines from the bit line side. In the present embodiment, it is assumed that the programming process is a sequential programming process performed in order from a control gate line WL(n) on the source side to a control gate line WL(1) on the bit line side. A case wherein the kth control gate line from the bit line side is used for programming (FIG. 15B) is explained as an example. Program voltage Vpgm is applied to a selected control gate line WL(k). Low voltage Vcutoff (for example, 0V) which cuts off the memory transistor is applied to control gate lines WL(k−i), WL(k+j) (i and j are integers equal to or larger than 2). Intermediate voltage Vpass(k,1) is applied to non-selected control gate lines which lie on the bit line side with respect to the selected control gate line and are different from the above control gate lines. Further, intermediate voltage Vpass(k,2) higher than Vpass(k,1) is applied to non-selected control gate lines which lie on the source line side with respect to the selected control gate line and are different from the above control gate lines (Vpass(k,1)<Vpass(k,2)).

In the present embodiment, two types of intermediate voltages Vpass are used in the simultaneous programming process with respect to each of the control gate lines and the Vpass values are changed for the control gate lines in the respective bias states. Therefore, 2n types of intermediate voltages Vpass at maximum are used. In the conventional case, only one type of Vpass is used as the intermediate voltage and it is basically different from the present embodiment in this point.

In the present embodiment, it is assumed that one memory transistor to be cut off is provided on each of the bit line side and source line side of the selected memory transistor and it is different from the seventh embodiment in this point. Two or more memory transistors which are cut off can be provided.

Thus, the total erroneous programming stress can be reduced by setting the intermediate voltage Vpass to more finely optimized values.

In this example, it is assumed that 2n types of intermediate voltages Vpass at maximum are used, but it is not necessary to use different values for all of them. It is only required to provide the least sufficient number of intermediate voltages according to the effect of the erroneous programming characteristic.

Ninth Embodiment

A nonvolatile semiconductor memory device according to a ninth embodiment of this invention has basically the same configuration as that of the first embodiment and can be realized by modifying the row decoder 13 in the circuit of FIG. 5 to perform the selection operation as will be described below.

Figure 16A:
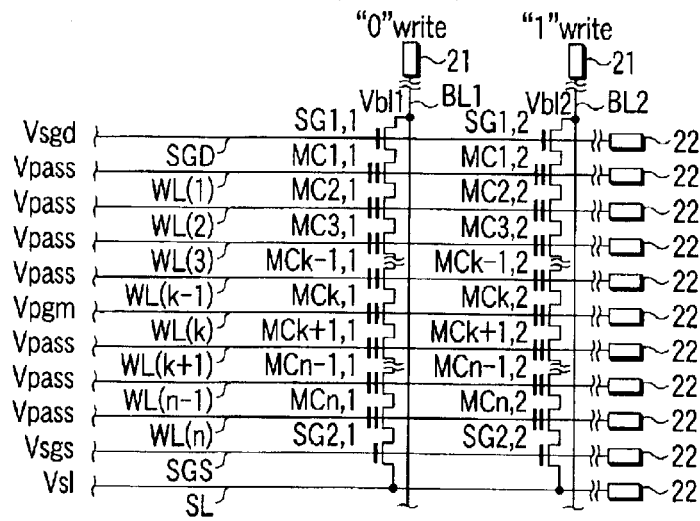
FIG. 16A is an equivalent circuit diagram showing a bias state at the time of data programming into a memory transistor connected to the kth (in the case of k>m) control gate line from the bit line side, for illustrating a nonvolatile semiconductor memory device according to an eighth embodiment of the present invention.
Figure 16B:
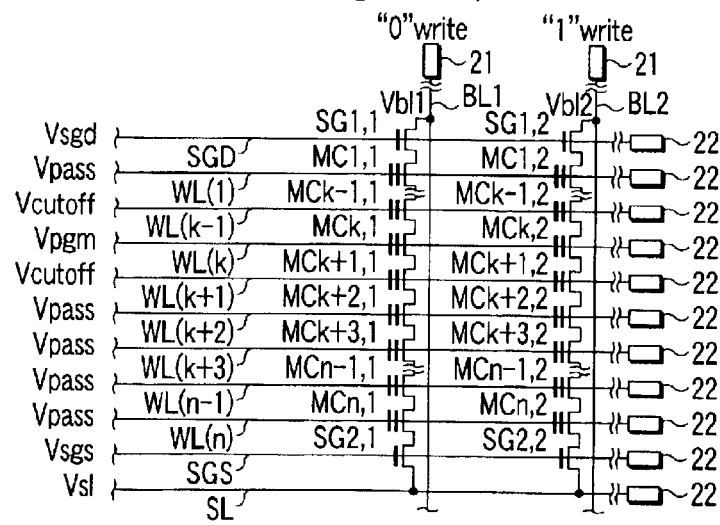
FIG. 16B is an equivalent circuit diagram showing a bias state at the time of data programming into a memory transistor connected to the kth (in the case of k≦m) control gate line from the bit line side, for illustrating the nonvolatile semiconductor memory device according to the eighth embodiment of the present invention.

It is assumed that the kth control gate line from the bit line side is used for programming. FIGS. 16A and 16B respectively show cases of k>m and k≦m if m is an integer between 1 and n both inclusive. In the present embodiment, it is assumed that the programming process is a sequential programming process performed in order from a control gate line WL(n) on the source side to a control gate line WL(1)

on the bit line side. The feature of the present embodiment is that the channel voltage control system is changed according to the position of a control gate line used for programming. In the case of FIG. 16A, the SB system is used in which intermediate voltage Vpass is applied to non-selected control gate lines and the voltage of all of the channels which lie in the NAND cell unit and are treated as one integral part is boosted. In the case of FIG. 16B, the LSB system is used in which low voltage Vcutoff (for example, 0V) which cuts off the memory transistor is applied to control gate lines lying on both sides of a selected control gate line, an area to be boosted is limited and the boosting efficiency is enhanced. The channel voltage control system having high boosting efficiency is used only for an area in which Vpgm stress becomes large so as to prevent erroneous programming.

In this case, m can be set to an optimum value according to the magnitude of Vpgm stress. Further, in the present embodiment, it is assumed that two memory transistors to be cut off are used, but three or more memory transistors can be used.

Tenth Embodiment

A nonvolatile semiconductor memory device according to a tenth embodiment of this invention has basically the same configuration as that of the first embodiment and can be realized by modifying the row decoder 13 in the circuit of FIG. 5 to perform the selection operation as will be described below.

Figure 17A:
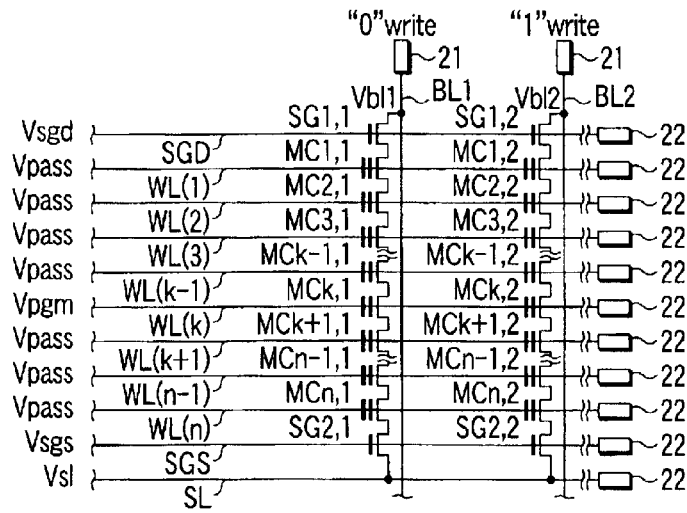
FIG. 17A is an equivalent circuit diagram showing a bias state at the time of data programming into a memory transistor connected to the kth (in the case of k>m) control gate line from the bit line side, for illustrating a nonvolatile semiconductor memory device according to a tenth embodiment of the present invention.
Figure 17B:
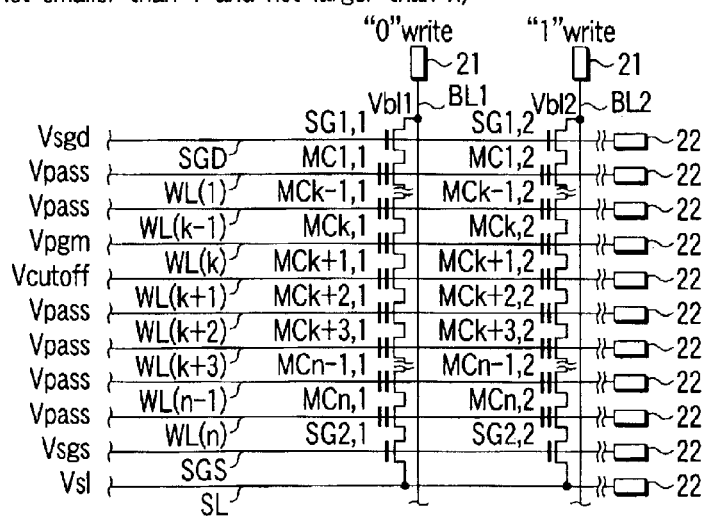
FIG. 17B is an equivalent circuit diagram showing a bias state at the time of data programming into a memory transistor connected to the kth (in the case of k≦m) control gate line from the bit line side, for illustrating the nonvolatile semiconductor memory device according to the tenth embodiment of the present invention.

It is assumed that the kth control gate line from the bit line side is used for programming. FIGS. 17A and 17B respectively show cases of k>m and k≦m if m is an integer from 1 to n both inclusive. In the present embodiment, it is assumed that the programming process is a sequential programming process performed in order from a control gate line WL(n) on the source side to a control gate line WL(1) on the bit line side. The feature of the present embodiment is that the channel voltage control system is changed according to the position of a control gate line used for programming. In the case of FIG. 17A, the SB system is used in which intermediate voltage Vpass is applied to non-selected control gate lines and the voltage of all of the channels which lie in the NAND cell unit and are treated as one integral part is boosted. In the case of FIG. 17B, the EASB system is used in which low voltage Vcutoff (for example, 0V) which cuts off the memory transistor is applied to a control gate line lying on the source line side of a selected control gate line, an area to be boosted is limited and the boosting efficiency is enhanced. The channel voltage control system having high boosting efficiency is used only for an area in which Vpgm stress becomes large so as to prevent erroneous programming.

In this case, m can be set to an optimum value according to the magnitude of Vpgm stress. Further, in the present embodiment, it is assumed that one memory transistor to be cut off is used, but two or more memory transistors can be used.

Eleventh Embodiment

A nonvolatile semiconductor memory device according to an eleventh embodiment of this invention has basically the same configuration as that of the first embodiment and can be realized by modifying the row decoder 13 in the circuit of FIG. 5 to perform the selection operation as will be described below.

Figure 18A:
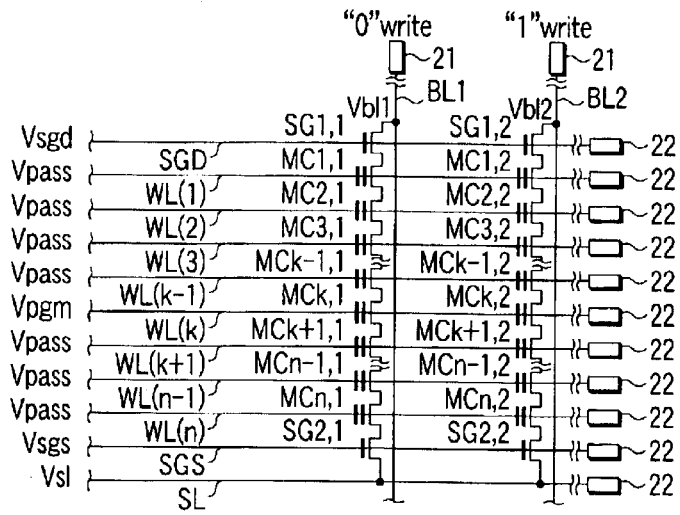
FIG. 18A is an equivalent circuit diagram showing a bias state at the time of data programming into a memory transistor connected to the kth (in the case of k>m) control gate line from the bit line side, for illustrating a nonvolatile semiconductor memory device according to an eleventh embodiment of the present invention.
Figure 18B:
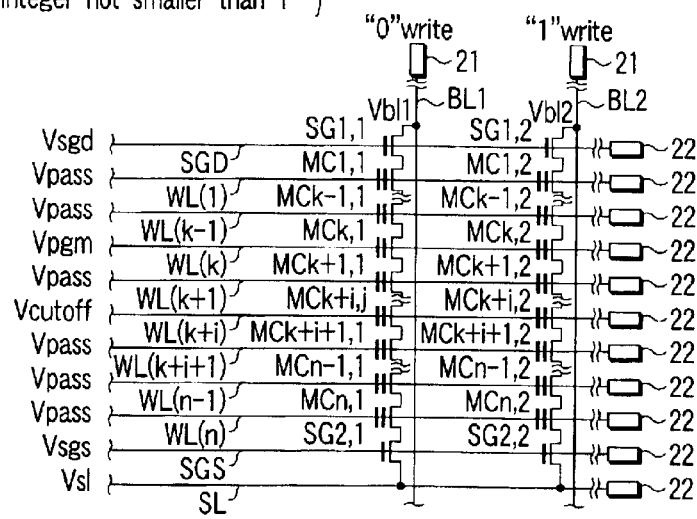
FIG. 18B is an equivalent circuit diagram showing a bias state at the time of data programming into a memory transistor connected to the kth (in the case of k≦m) control gate line from the bit line side, for illustrating the nonvolatile semiconductor memory device according to the eleventh embodiment of the present invention.

It is assumed that the kth control gate line from the bit line side is used for programming. FIGS. 18A and 18B respectively show cases of k>m and k≦m if m is an integer from 1 to n both inclusive. In the present embodiment, it is assumed that the programming process is a sequential programming process performed in order from a control gate line WL(n) on the source side to a control gate line WL(1) on the bit line side. The feature of the present embodiment is that the channel voltage control system is changed according to the position of a control gate line used for programming. In the case of FIG. 18A, the SB system is used in which intermediate voltage Vpass is applied to non-selected control gate lines and the voltage of all of the channels which lie in the NAND cell unit and are treated as one integral part is boosted. In the case of FIG. 18B, low voltage Vcutoff (for example, 0V) which cuts off the memory transistor is applied to a (k+i)th (i is an integer equal to or larger than 1) control gate line from the bit line side and a channel region to be boosted is limited so as to enhance the boosting efficiency. The channel voltage control system having high boosting efficiency is used only for an area in which Vpgm stress becomes large so as to prevent erroneous programming.

In this case, m can be set to an optimum value according to the magnitude of Vpgm stress. Further, in the present embodiment, it is assumed that one memory transistor to be cut off is used, but two or more memory transistors can be used.

Twelfth Embodiment

A nonvolatile semiconductor memory device according to a twelfth embodiment of this invention has basically the same configuration as that of the first embodiment and can be realized by modifying the row decoder 13 in the circuit of FIG. 5 to perform the selection operation as will be described below.

Figure 19A:
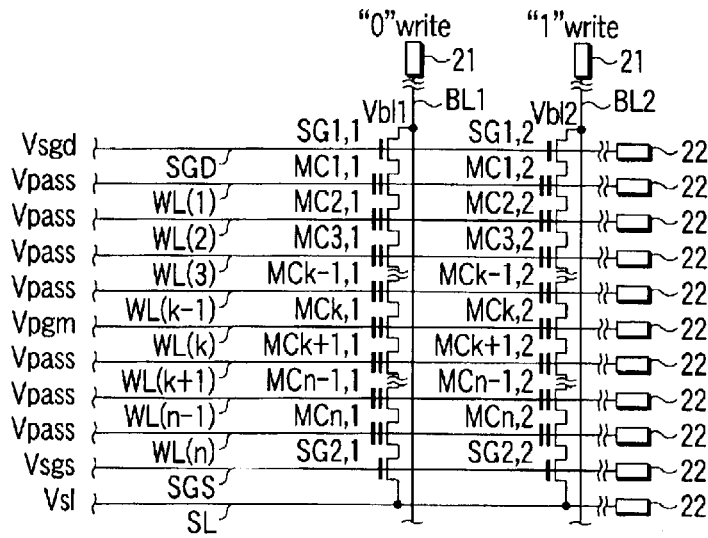
FIG. 19A is an equivalent circuit diagram showing a bias state at the time of data programming into a memory transistor connected to the kth (in the case of k>m) control gate line from the bit line side, for illustrating a nonvolatile semiconductor memory device according to a twelfth embodiment of the present invention.
Figure 19B:
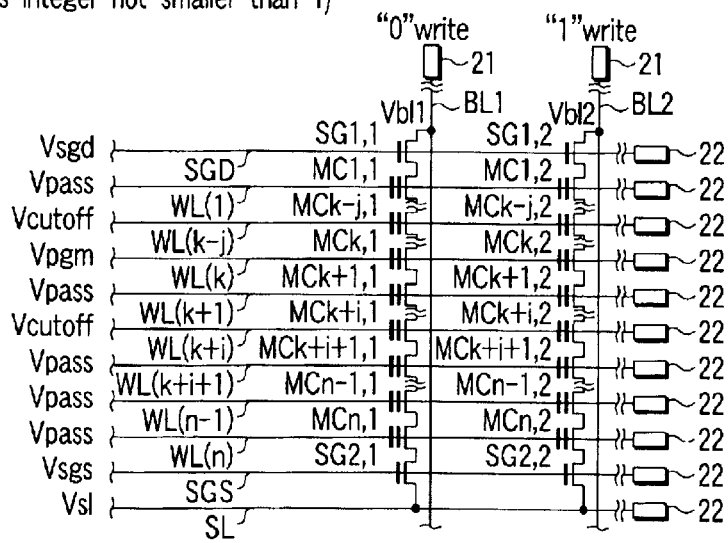
FIG. 19B is an equivalent circuit diagram showing a bias state at the time of data programming into a memory transistor connected to the kth (in the case of k≦m) control gate line from the bit line side, for illustrating the nonvolatile semiconductor memory device according to the twelfth embodiment of the present invention.

It is assumed that the kth control gate line from the bit line side is used for programming. FIGS. 19A and 19B respectively show cases of k>m and k≦m if m is an integer from 1 to n both inclusive. In the present embodiment, it is assumed that the programming process is a sequential programming process performed in order from a control gate line WL(n) on the source side to a control gate line WL(1) on the bit line side. The feature of the present embodiment is to change the channel voltage control system according to the position of a control gate line used for programming. In the case of FIG. 19A, the SB system is used in which intermediate voltage Vpass is applied to non-selected control gate lines and the voltage of all of the channels which lie in the NAND cell unit and are treated as one integral part is boosted. In the case of FIG. 19B, low voltage Vcutoff (for example, 0V) which cuts off the memory transistor is applied to (k+i)th and (k−j)th (i and j are integers equal to or larger than 1) control gate lines from the bit line side and a channel region to be boosted is limited so as to enhance the boosting efficiency. The channel voltage control system having high boosting efficiency is used only for an area in which Vpgm stress becomes large so as to prevent erroneous programming.

In this case, m can be set to an optimum value according to the magnitude of Vpgm stress. Further, in the present embodiment, it is assumed that two memory transistors to be cut off are used, but three or more memory transistors can be used.

Thirteenth Embodiment

FIG. 20 is a block diagram showing an extracted main portion of a nonvolatile semiconductor memory device according to a thirteenth embodiment of the present invention, for illustrating the nonvolatile semiconductor memory device. In a memory cell array 11, NAND cell units are arranged in row and column directions in a matrix form and control gate lines, bit lines, selection gate lines, source lines and the like are wired. A bit line control circuit 12 and row decoder 13 are connected to the memory cell array 11. The bit line control circuit 12 performs operations of latching program data, sensing data at the readout time and the like. A column decoder 14 which decodes a column address signal to select a column of the NAND cell units is connected to the bit line control circuit 12. A booster circuit 15 creates and generates program voltage Vpgm, a plurality of different intermediate voltages Vpass1 to Vpassn and bit line voltage Vbl from the power supply voltage. The row decoder 13 supplies a control signal to the booster circuit 15 and is supplied with the program voltage Vpgm and intermediate voltages Vpass1 to Vpassn. The row decoder 13 decodes a row address signal and outputs decode signals Vpgm, Vpass1 to Vpassn, Vsg, Vss of various voltages which are used to select memory transistors in the memory cell array 11 based on the voltage supplied from the booster circuit 15. Thus, the control gate line and selection gate line in the memory cell array 11 are selected. Further, the bit line control circuit 12 receives the bit line voltage Vbl from the booster circuit 15 and supplies the voltage to the column of the NAND cell unit which is selected by the column decoder 14.

In FIG. 20, only the circuits required for explaining the present embodiment are shown. It should be noted that an address buffer, data input/output buffer, timing generator circuit and the like are not shown although they are additionally required.

In the case of programming, voltages such as the program voltage Vpgm, intermediate voltages Vpass1 to Vpassn and bit line voltage Vbl are created and generated based on the power supply voltage in the booster circuit 15. The above voltages are applied to the control line, selection gate line and source line of the selected block via the row decoder 13 and the data programming operation is performed via a selected control gate line. When attention is paid to voltage applied to the control gate line, the program voltage Vpgm is applied to the selected control gate line and different Vpass voltages are applied to the non-selected control gate lines so as to alleviate weak program stress occurring due to the intermediate voltages Vpass in the non-selected control gate lines.

Figure 21A:
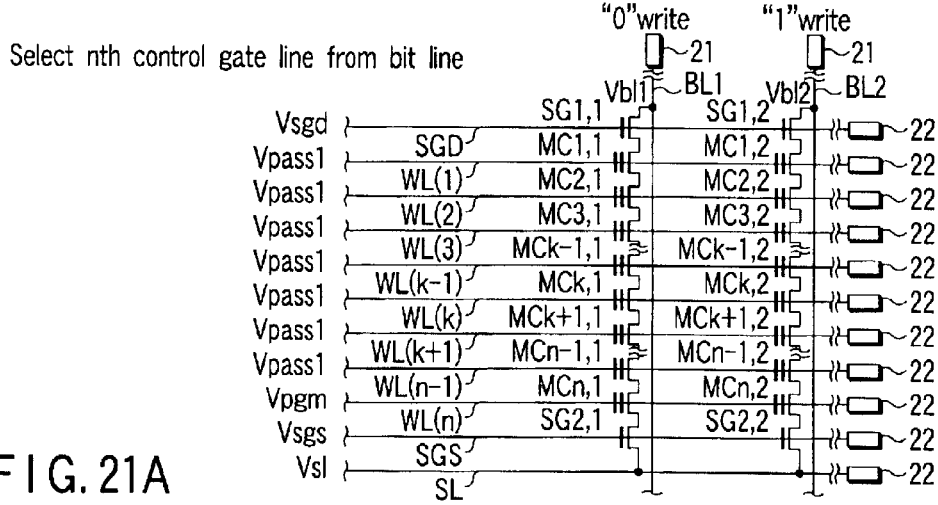
FIG. 21A is an equivalent circuit diagram showing a bias state at the time of data programming into a memory transistor connected to the nth control gate line from the bit line side, for illustrating the nonvolatile semiconductor memory device according to a thirteenth embodiment of the present invention.
Figure 21B:
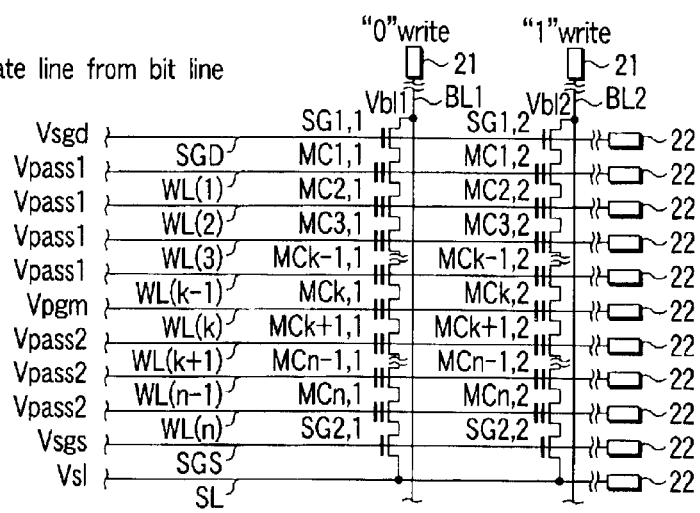
FIG. 21B is an equivalent circuit diagram showing a bias state at the time of data programming into a memory transistor connected to the kth control gate line from the bit line side, for illustrating the nonvolatile semiconductor memory device according to the thirteenth embodiment of the present invention.
Figure 21C:
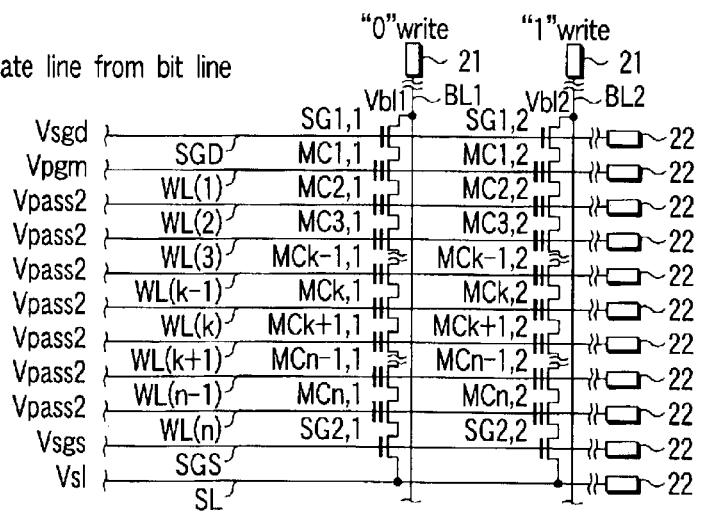
FIG. 21C is an equivalent circuit diagram showing a bias state at the time of data programming into a memory transistor connected to the first control gate line from the bit line side, for illustrating the nonvolatile semiconductor memory device according to the thirteenth embodiment of the present invention.

FIGS. 21A, 21B and 21C are equivalent circuit diagrams showing bias states at the time of data programming into memory transistors respectively connected to the nth, kth and first control gate lines from the bit line side. In the present embodiment, it is assumed that the programming process is a sequential programming process performed in order from a control gate line WL(n) on the source side to a control gate line WL(1) on the bit line side. A case of the kth control gate line from the bit line side (FIG. 21B) is explained as an example. The program voltage Vpgm is applied to a selected control gate line WL(k). The intermediate voltage Vpass1 is applied to control gate lines WL(1) to WL(k−1) between the selected control gate line WL(k) and a selection gate line SGD on the bit line side. The intermediate voltage Vpass2 higher than Vpass1 is applied to control gate lines WL(k+1) to WL(n) between the selected control gate line WL(k) and a selection gate line SGS on the source line side (Vpass1<Vpass2). In the conventional case shown in FIG. 1, only one type of Vpass is used as the intermediate voltage and it is basically different from the present embodiment in this point.

Figure 4:
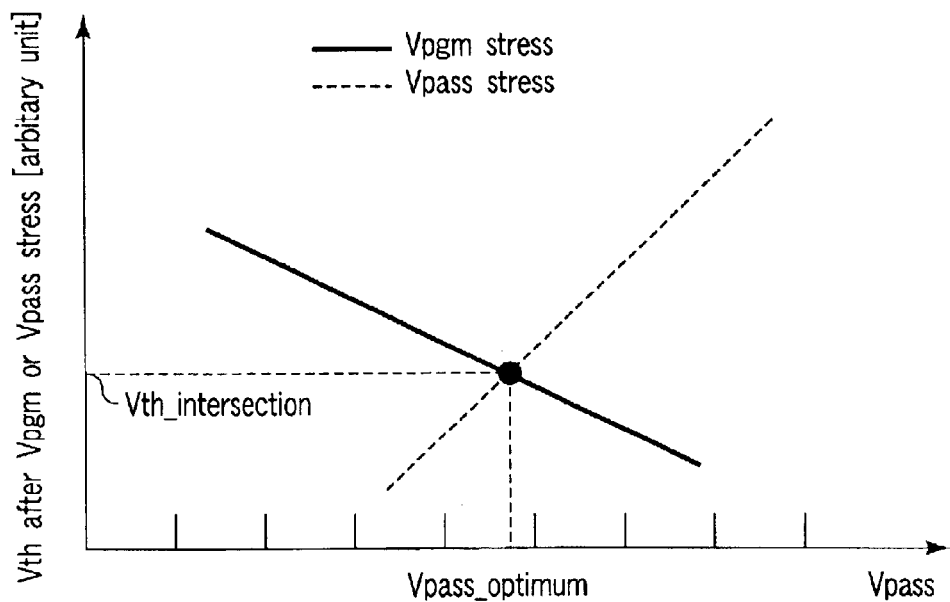
FIG. 4 is a characteristic diagram for illustrating the dependency of Vpgm stress and Vpass stress on Vpass.
Figure 22A:
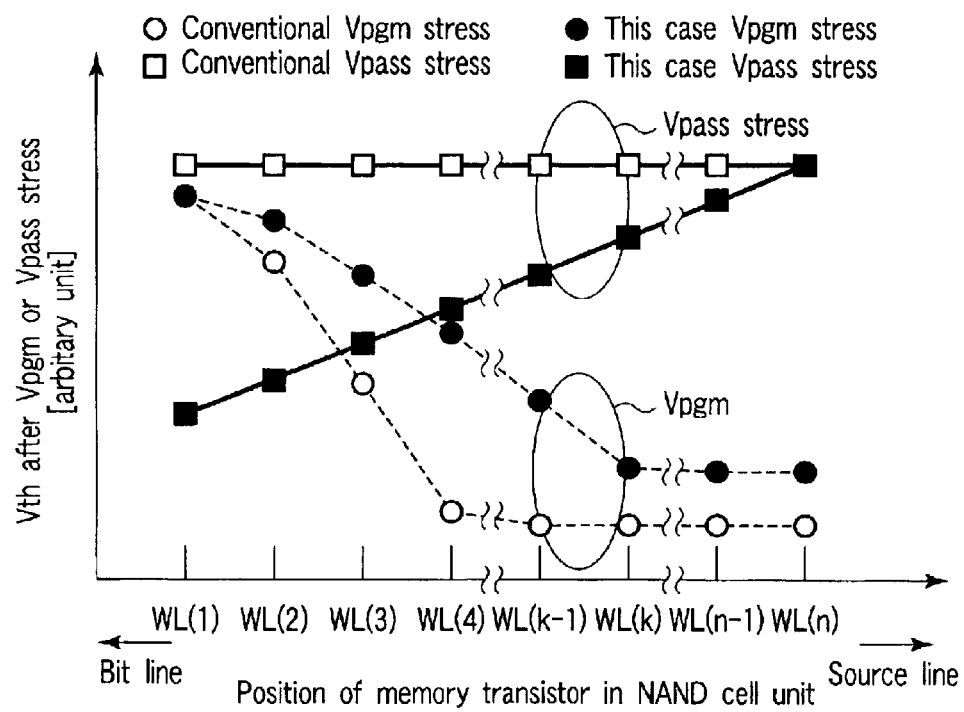
FIG. 22A is a characteristic diagram showing Vpgm stress and Vpass stress in comparison with each other, for illustrating the programming system according to the thirteenth embodiment of the present invention in comparison with the conventional programming system.
Figure 22B:
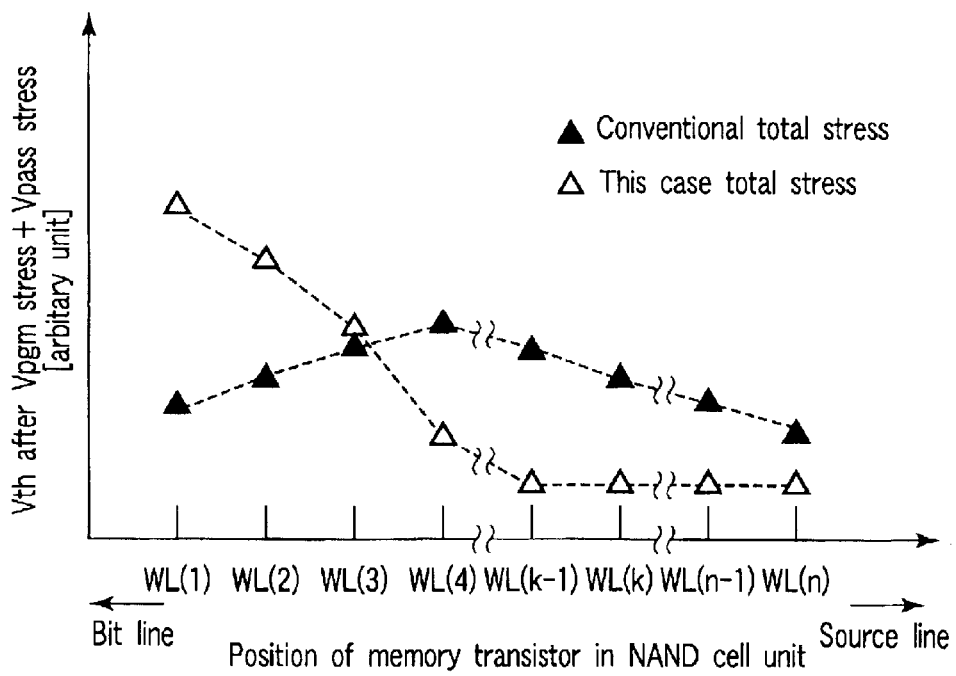
FIG. 22B is a characteristic diagram showing total erroneous programming stresses in comparison with each other, for illustrating the programming system according to the thirteenth embodiment of the present invention in comparison with the conventional programming system.

The present embodiment is compared with the SB system in which the conventional sequential programming process is used with reference to FIGS. 22A and 22B. In the case of the SB system in which the conventional sequential programming process is used, the Vpgm stress becomes smaller in a memory transistor which is farther away from the bit line as described before (refer to FIG. 4). Therefore, it is considered that the worst case of the Vpgm stress occurs in the first memory transistor MC1,2 from the bit line side (as shown by circles in FIG. 22A). Since a single Vpass value is used, the Vpass stress becomes constant irrespective of the position of the memory transistor in the NAND cell unit (indicated by voided squares in FIG. 22A). Since total erroneous programming stress applied to "1" data is (Vpgm stress+Vpass stress), the first memory transistor from the bit line side receives the maximum erroneous programming stress (indicated by voided triangles in FIG. 22B).

The ground for the advantage of the present embodiment is schematically explained. First, a Vpass value which is approximately equal to that in the conventional case is used as Vpass2. In the present embodiment, since Vpass1 applied to the memory transistors MC1,2 to MCk-1,2 in the erase state is lower than that used in the conventional case, there occurs a possibility that Vpgm stress will become slightly larger (indicated by black dots in FIG. 22A). However, since the boosting effect is large in the memory transistor in the erase state, the Vpgm stress can be prevented from greatly increasing if an adequate Vpass1 value is selected. The Vpass stress can be reduced by lowering the intermediate voltage Vpass1. As a result, the Vpass stress has dependency on the position of the memory transistor in the NAND cell unit. That is, the Vpass stress becomes smaller in the memory transistors which lie nearer to the bit lines BL1, BL2, . . . (indicated by black-painted squares in FIG. 22A). The worst case of the Vpass stress occurs in the nth memory transistor from the bit line side, and at this time, the Vpass stress becomes the same as that in the conventional case.

As described above, the total erroneous programming stress (Vpgm stress+Vpass stress) of the present embodiment can be expressed as indicated by black-painted triangles in FIG. 22B. When the maximum values of the total erroneous programming stresses are compared with each other in FIG. 22B, the erroneous programming stress can be reduced in comparison with the conventional case by using an adequate Vpass1 value.

Fourteenth Embodiment

A nonvolatile semiconductor memory device according to a fourteenth embodiment of this invention has basically the same configuration as that of the thirteenth embodiment and can be realized by modifying the row decoder 13 in the circuit of FIG. 20 to perform the selection operation as will be described below.

FIGS. 23A, 23B and 23C are equivalent circuit diagrams showing bias states at the time of data programming into memory transistors respectively connected to the nth, kth and first control gate lines from the bit line side. In the present embodiment, it is assumed that the programming process is a sequential programming process performed in order from a control gate line WL(n) on the source side to a control gate line WL(1) on the bit line side. A case of the kth control gate line from the bit line side (FIG. 23B) is explained as an example. Program voltage Vpgm is applied to a selected control gate line WL(k). Low voltage Vcutoff (for example, 0V) which cuts off the memory transistor is applied to a control gate line WL(k+1) which lies adjacent to and on the source line side of the selected control gate line WL(k). Intermediate voltage Vpass1 is applied to non-selected control gate lines WL(1) to WL(k−1) on the bit line side other than the above control gate lines. Further, intermediate voltage Vpass2 higher than Vpass1 is applied to control gate lines WL(k+2) to WL(n) on the source line side other than the above control gate lines (Vpass1<Vpass2). In the conventional case, only one type of Vpass is used as the intermediate voltage and it is basically different from the present embodiment in this point.

In the present embodiment, it is assumed that one memory transistor which is cut off is provided on the source line side of the selected memory transistor, but two or more memory transistors can be provided.

The superiority of the present embodiment to the conventional EASB system is basically the same as that described in the thirteenth embodiment. The total erroneous programming stress which is expressed by the sum of Vpgm stress and Vpass stress can be reduced by setting Vpass2 to a value which is approximately equal to Vpass used in the conventional system and lowering Vpass1 without extremely increasing the Vpgm stress.

Fifteenth Embodiment

A nonvolatile semiconductor memory device according to a fifteenth embodiment of this invention has basically the same configuration as that of the thirteenth embodiment and can be realized by modifying the row decoder 13 in the circuit of FIG. 20 to perform the selection operation as will be described below.

Figure 24A:
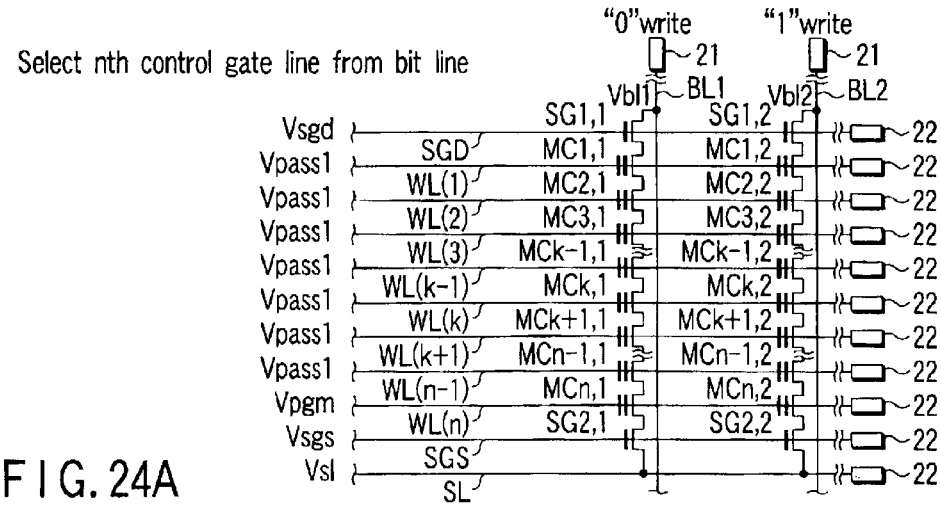
FIG. 24A is an equivalent circuit diagram showing a bias state at the time of data programming into a memory transistor connected to the nth control gate line from the bit line side, for illustrating a nonvolatile semiconductor memory device according to a fifteenth embodiment of the present invention.
Figure 24B:
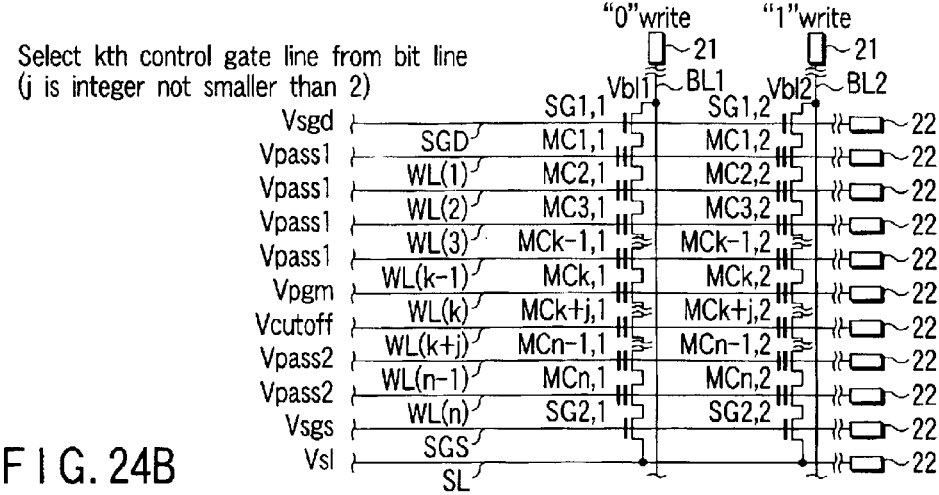
FIG. 24B is an equivalent circuit diagram showing a bias state at the time of data programming into a memory transistor connected to the kth control gate line from the bit line side, for illustrating the nonvolatile semiconductor memory device according to the fifteenth embodiment of the present invention.
Figure 24C:
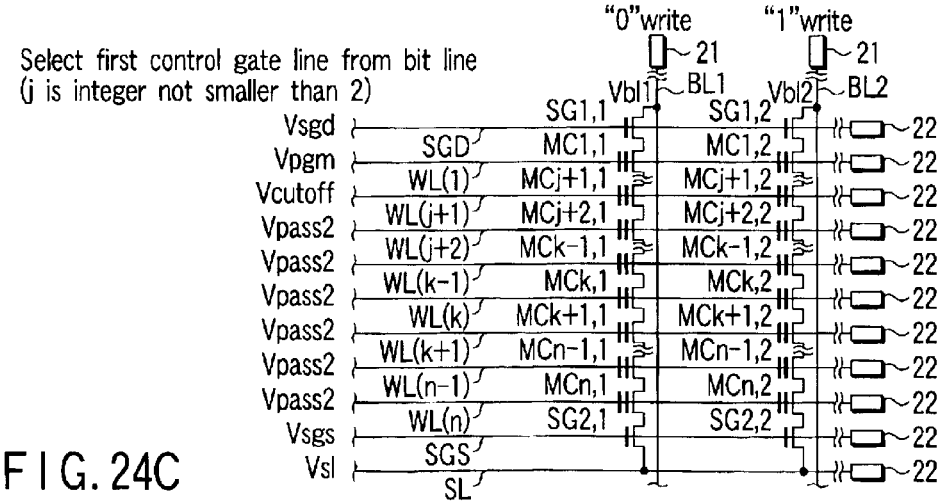
FIG. 24C is an equivalent circuit diagram showing a bias state at the time of data programming into a memory transistor connected to the first control gate line from the bit line side, for illustrating the nonvolatile semiconductor memory device according to the fifteenth embodiment of the present invention.

FIGS. 24A, 24B and 24C are equivalent circuit diagrams showing bias states at the time of data programming into memory transistors respectively connected to the nth, kth and first control gate lines from the bit line side. In the present embodiment, it is assumed that the programming process is a sequential programming process performed in order from a control gate line WL(n) on the source side to a control gate line WL(1) on the bit line side. The present embodiment is different from the fourteenth embodiment in the position of the memory transistor which is cut off.

A case of the kth control gate line from the bit line side (FIG. 24B) is explained as an example. Program voltage Vpgm is applied to a selected control gate line WL(k). Low voltage Vcutoff (for example, 0V) which cuts off the memory transistor is applied to a control gate line WL(k+j) (j is an integer equal to or larger than 2). Intermediate voltage Vpass1 is applied to non-selected control gate lines which are different from the above control gate lines and lie on the bit line side with respect to the selected control gate line. Further, intermediate voltage Vpass2 higher than Vpass1 is applied to control gate lines which are different from the above control gate lines and lie on the source line side with respect to the selected control gate line (Vpass1<Vpass2). In the conventional case, only one type of Vpass is used as the intermediate voltage and it is basically different from the present embodiment in this point.

In the present embodiment, it is assumed that one memory transistor which is cut off is provided on the source line side of the selected memory transistor, but two or more memory transistors can be provided.

The superiority of the present embodiment to the conventional EASB system is basically the same as that described in the thirteenth embodiment. The total erroneous programming stress which is expressed by the sum of Vpgm stress and Vpass stress can be reduced by setting Vpass2 to a value which is approximately equal to Vpass used in the conventional system and lowering Vpass1 without extremely increasing the Vpgm stress.

Sixteenth Embodiment

A nonvolatile semiconductor memory device according to a sixteenth embodiment of this invention has basically the same configuration as that of the thirteenth embodiment and can be realized by modifying the row decoder 13 in the circuit of FIG. 20 to perform the selection operation as will be described below.

Figure 25A:
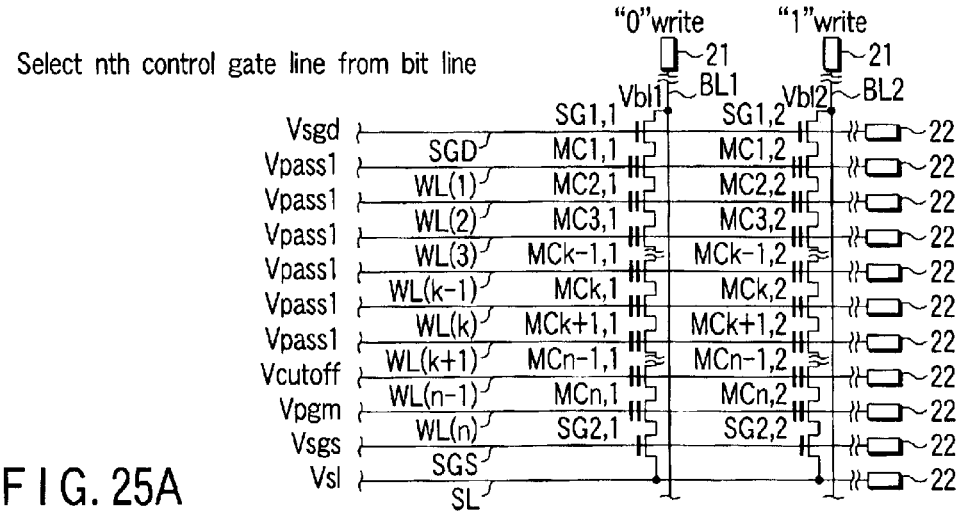
FIG. 25A is an equivalent circuit diagram showing a bias state at the time of data programming into a memory transistor connected to the nth control gate line from the bit line side, for illustrating a nonvolatile semiconductor memory device according to a sixteenth embodiment of the present invention.
Figure 25B:
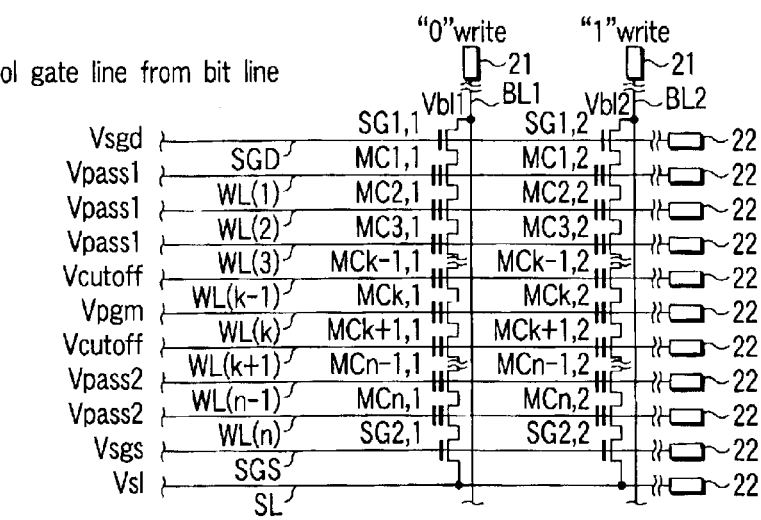
FIG. 25B is an equivalent circuit diagram showing a bias state at the time of data programming into a memory transistor connected to the kth control gate line from the bit line side, for illustrating the nonvolatile semiconductor memory device according to the sixteenth embodiment of the present invention.
Figure 25C:
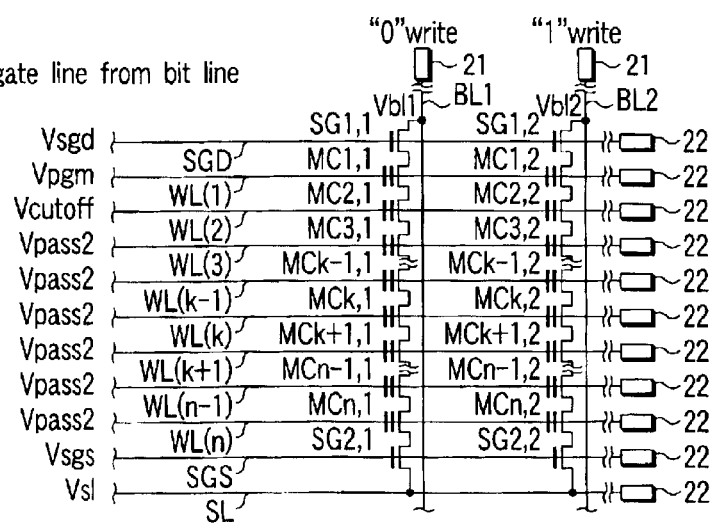
FIG. 25C is an equivalent circuit diagram showing a bias state at the time of data programming into a memory transistor connected to the first control gate line from the bit line side, for illustrating the nonvolatile semiconductor memory device according to the sixteenth embodiment of the present invention.

FIGS. 25A, 25B and 25C are equivalent circuit diagrams showing bias states at the time of data programming into memory transistors respectively connected to the nth, kth and first control gate lines from the bit line side. In the present embodiment, it is assumed that the programming process is a sequential programming process performed in order from a control gate line WL(n) on the source side to a control gate line WL(1) on the bit line side. A case of the kth control gate line from the bit line side (FIG. 25B) is explained as an example. Program voltage Vpgm is applied to a selected control gate line WL(k). Low voltage Vcutoff (for example, 0V) which cuts off the memory transistor is applied to control gate lines WL(k−1), WL(k+1) which lie on both sides of the selected control gate line WL(k). Intermediate voltage Vpass1 is applied to non-selected control gate lines WL(1) to WL(k−2) on the bit line side other than the above control gate lines. Further, intermediate voltage Vpass2 higher than Vpass1 is applied to control gate lines WL(k+2) to WK(n) on the source line side other than the above control gate lines (Vpass1<Vpass2). In the conventional case, only one type of Vpass is used as the intermediate voltage and it is basically different from the present embodiment in this point.

In the present embodiment, it is assumed that one memory transistor which is cut off is provided on each of the bit line side and source line side of the selected memory transistor, but two or more memory transistors can be provided on each side.

The superiority of the present embodiment to the conventional LSB system is basically the same as that described in the thirteenth embodiment. The total erroneous programming stress which is expressed by the sum of Vpgm stress and Vpass stress can be reduced by setting Vpass2 to a value which is approximately equal to Vpass used in the conventional system and lowering Vpass1 without extremely increasing the Vpgm stress.

Seventeenth Embodiment

A nonvolatile semiconductor memory device according to a seventeenth embodiment of this invention has basically the same configuration as that of the thirteenth embodiment and can be realized by modifying the row decoder 13 in the circuit of FIG. 20 to perform the selection operation as will be described below.

Figure 26A:
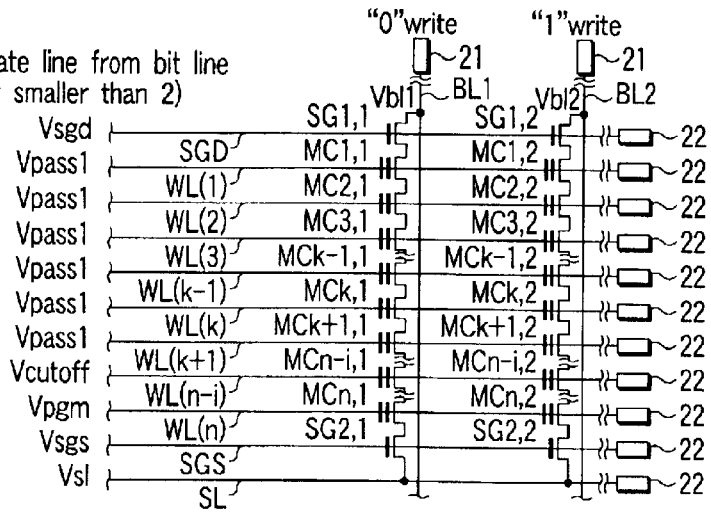
FIG. 26A is an equivalent circuit diagram showing a bias state at the time of data programming into a memory transistor connected to the nth control gate line from the bit line side, for illustrating a nonvolatile semiconductor memory device according to a seventeenth embodiment of the present invention.
Figure 26B:
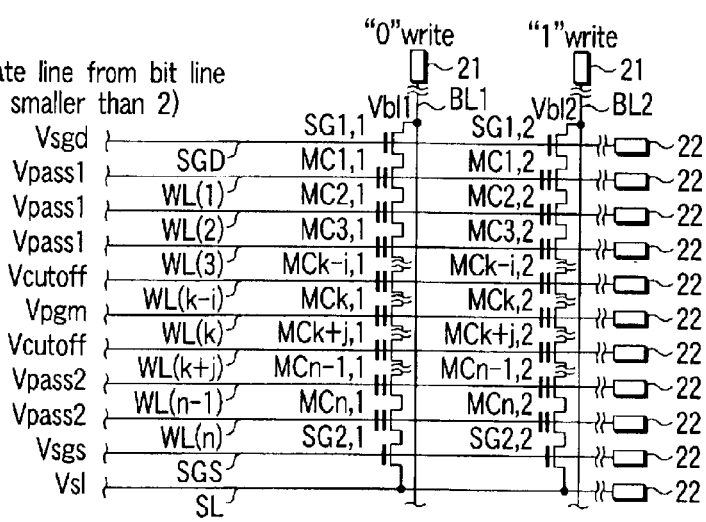
FIG. 26B is an equivalent circuit diagram showing a bias state at the time of data programming into a memory transistor connected to the kth control gate line from the bit line side, for illustrating the nonvolatile semiconductor memory device according to the seventeenth embodiment of the present invention.
Figure 26C:
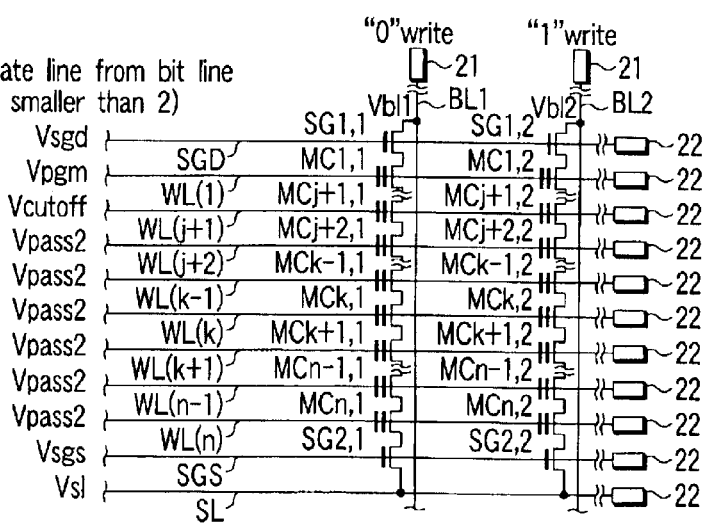
FIG. 26C is an equivalent circuit diagram showing a bias state at the time of data programming into a memory transistor connected to the first control gate line from the bit line side, for illustrating the nonvolatile semiconductor memory device according to the seventeenth embodiment of the present invention.

FIGS. 26A, 26B and 26C are equivalent circuit diagrams showing bias states at the time of data programming into memory transistors respectively connected to the nth, kth and first control gate lines from the bit line side. In the present embodiment, it is assumed that the programming process is a sequential programming process performed in order from a control gate line WL(n) on the source side to a control gate line WL(1) on the bit line side. The present embodiment is different from the fourteenth embodiment in the position of the memory transistor which is cut off.

A case of the kth control gate line from the bit line side (FIG. 26B) is explained as an example. Program voltage Vpgm is applied to a selected control gate line WL(k). Low voltage Vcutoff (for example, 0V) which cuts off the memory transistor is applied to control gate lines WL(k−i), WL(k+j) (i and j are integers equal to or larger than 2). Intermediate voltage Vpass1 is applied to non-selected control gate lines which are different from the above control gate lines and lie on the bit line side with respect to the selected control gate line. Further, intermediate voltage Vpass2 higher than Vpass1 is applied to control gate lines which are different from the above control gate lines and lie on the source line side with respect to the selected control gate line (Vpass1<Vpass2). In the conventional case, only one type of Vpass is used as the intermediate voltage and it is basically different from the present embodiment in this point.

In the present embodiment, it is assumed that one memory transistor which is cut off is provided on each of the bit line side and source line side of the selected memory transistor, but two or more memory transistors can be provided on each side.

The superiority of the present embodiment to the conventional LSB system is basically the same as that described in the thirteenth embodiment. The total erroneous programming stress which is expressed by the sum of Vpgm stress and Vpass stress can be reduced by setting Vpass2 to a value which is approximately equal to Vpass used in the conventional system and lowering Vpass1 without extremely increasing the Vpgm stress.

Application Example

Figure 27:
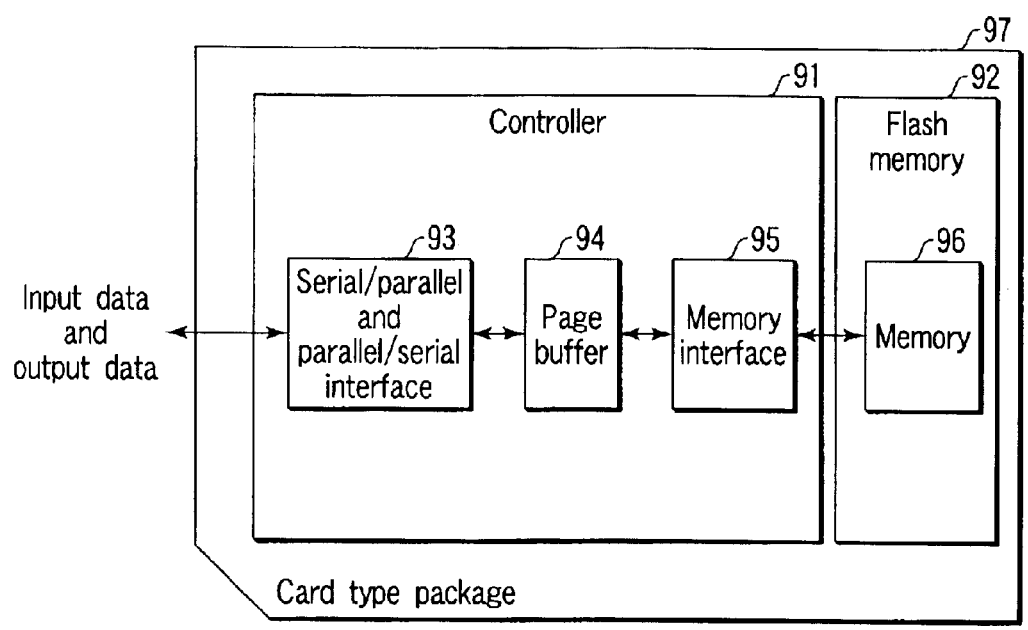
FIG. 27 is a block diagram showing an example of a memory card, for illustrating an application example of a nonvolatile semiconductor memory device according to an embodiment of the present invention.

FIG. 27 is a block diagram showing an example of a memory card, for illustrating an application example of a nonvolatile semiconductor memory device according to an embodiment of the present invention.

As shown in FIG. 27, a memory chip (Flash memory) 92 used as a main memory and a controller chip (controller) 91 which controls the memory chip 92 are contained in a memory card 97. Only circuit blocks associated with the main memory among circuit blocks contained in the memory chip 91 are shown in FIG. 27 and explained with reference to FIG. 27.

As the circuit blocks associated with the main memory, for example, a serial/parallel and parallel/serial interface 93, page buffer 94 and memory interface 95 are provided.

For example, the interface 93 converts serial input data to parallel internal data when data is programmed into the memory chip 92. The converted parallel internal data is input to and stored in the page buffer 94. The stored internal data is supplied to the memory chip 92 via the memory interface 95 and programmed therein.

Further, when data is read out from the memory card 97, data read out from the memory chip 92 is input to the page buffer 94 via the memory interface 95 and stored therein. The stored internal data is supplied to the interface 93 which in turn converts the parallel internal data into serial output data and then the serial output data is output to the exterior of the memory card 97.

As shown in FIG. 27, the controller chip 91 and memory chip 92 are received into, mounted on or attached to a card type package and the assembly functions as a memory card.

The nonvolatile semiconductor memory devices explained in the first to seventeenth embodiments are each used in a memory circuit 96 in the memory chip 92. In the semiconductor memory devices explained in the respective embodiments, stresses can be reduced and erroneous programming can be prevented by using the sequential programming system. Therefore, according to the memory card 97 using the semiconductor memory device according to each of the above embodiments, it is possible to attain an advantage that stresses can be reduced and erroneous programming can be prevented at the time of data transfer between the memory card 97 and an electronic device connected thereto, particularly, at the time of sequential data programming from the electronic device. Because of the above advantage, the memory card 97 using the nonvolatile semiconductor memory device can be effectively used as a recording medium of an electronic device in which sequential data programming is required, for example, a video camera, digital still camera and personal digital assistant.

This invention has been explained by use of the first to seventeenth embodiments and the application example thereof, but this invention is not limited to the above embodiments and the application example thereof and can be variously modified without departing from the technical scope thereof when it is put into practice. For example, in the first to seventeenth embodiments, the stacked gate structure utilizing the charge storage layer is described, but this invention can be applied to a MONOS structure using a charge storage film such as an ONO film instead of the floating gate.

As described above, according to one aspect of this invention, attention is paid to a characteristic that the magnitude of total erroneous programming stress depends on the position of a word line used for programming (the position of a memory transistor in the NAND cell block). Then, the reliability in programming can be enhanced since the stress is reduced and erroneous programming can be prevented by changing the number of Vpass voltages and the way of applying the Vpass voltage when the sequential programming process is performed.

Further, the reliability in programming can be enhanced since the stress is reduced and erroneous programming can be prevented by changing the channel voltage control system depending on the position of the control gate line used for programming and using a system having high boosting efficiency only for a region in which Vpgm stress is large.

Additional advantages and modifications will readily occur to those skilled in the art. Therefore, the invention in its broader aspects is not limited to the specific details and representative embodiments shown and described herein. Accordingly, various modification may be made without departing from the spirit or scope of the general inventive concept as defined by the appended claims and their equivalents.

What is claimed is:

1. A nonvolatile semiconductor memory device comprising:
   a memory cell array having a plurality of memory cell blocks arranged in a column direction and control gate lines provided for each of the plurality of memory cell blocks, each of the memory cell blocks including a plurality of memory cell units arranged in a row direction and each connected to the control gate lines provided for the memory cell block, each of the plurality of memory cell units including a plurality of electrically data programmable and erasable memory transistors which are arranged in the column direction and whose current paths are serially connected, a first selection gate transistor having a current path connected at one end to one end of a current path of the series-connected memory transistors and connected at the other end to a bit line, and a second selection gate transistor having a current path connected at one end to the other end of the current path of the series-connected memory transistors and connected at the other end to a source line, and each of the control gate lines being commonly connected to control gates of those of the memory transistors which are arranged on a corresponding one of rows in the memory cell units of each of the memory cell blocks, a booster circuit which creates and generates program voltage, a plurality of different intermediate voltages and bit line voltage from power supply voltage, a row decoder which is supplied with the program voltage and the plurality of different intermediate voltages generated from the booster circuit, selects at least one of the control gate lines and selectively activates first and second selection gate lines respectively connected to gates of the first and second selection gate transistors, a bit line control circuit which is supplied with the bit line voltage generated from the booster circuit and performs operations of latching program data and sensing data at the readout time, and a column decoder which selects a column of the memory cell units, wherein the row decoder applies high voltage among the plurality of different intermediate voltages to non-selected control gate lines when the position of the selected control gate line lies near the bit line and applies low voltage among the plurality of different intermediate voltages to the non-selected control gate lines when the position of the selected control gate line is far away from the bit line.

2. A nonvolatile semiconductor memory device comprising:

a memory cell array having a plurality of memory cell blocks arranged in a column direction and control gate lines provided for each of the plurality of memory cell blocks, each of the memory cell blocks including a plurality of memory cell units arranged in a row direction and each connected to the control gate lines provided for the memory cell block, each of the plurality of memory cell units including a plurality of electrically data programmable and erasable memory transistors which are arranged in the column direction and whose current paths are serially connected, a first selection gate transistor having a current path connected at one end to one end of a current path of the series-connected memory transistors and connected at the other end to a bit line, and a second selection gate transistor having a current path connected at one end to the other end of the current path of the series-connected memory transistors and connected at the other end to a source line, and each of the control gate lines being commonly connected to control gates of those of the memory transistors which are arranged on a corresponding one of rows in the memory cell units of each of the memory cell blocks, a booster circuit which creates and generates program voltage, intermediate voltage and bit line voltage from power supply voltage, a row decoder which is supplied with the program voltage and intermediate voltage generated from the booster circuit, selects at least one of the control gate lines and selectively activates first and second selection gate lines respectively connected to gates of the first and second selection gate transistors, a bit line control circuit which is supplied with the bit line voltage generated from the booster circuit and performs operations of latching program data and sensing data at the readout time, and a column decoder which selects a column of the memory cell units, wherein the row decoder applies reference voltage which cuts off the memory transistor to at least one of non-selected control gate line lying near a selected control gate line and applies the intermediate voltage to non-selected control gate lines other than the above non-selected lines when the position of the selected control gate line lies near the bit line and applies the intermediate voltage to the non-selected control gate lines when the position of the selected control gate line is far away from the bit line.

3. A nonvolatile semiconductor memory device comprising:

a memory cell array having a plurality of memory cell blocks arranged in a column direction and control gate lines provided for each of the plurality of memory cell blocks, each of the memory cell blocks including a plurality of memory cell units arranged in a row direction and each connected to the control gate lines provided for the memory cell block, each of the plurality of memory cell units including a plurality of electrically data programmable and erasable memory transistors which are arranged in the column direction and whose current paths are serially connected, a first selection gate transistor having a current path connected at one end to one end of a current path of the series-connected memory transistors and connected at the other end to a bit line, and a second selection gate transistor having a current path connected at one end to the other end of the current path of the series-connected memory transistors and connected at the other end to a source line, and each of the control gate lines being commonly connected to control gates of those of the memory transistors which are arranged on a corresponding one of rows in the memory cell units of each of the memory cell blocks, a booster circuit which creates and generates program voltage, a plurality of different intermediate voltages and bit line voltage from power supply voltage, a row decoder which is supplied with the program voltage and the plurality of different intermediate voltages generated from the booster circuit, selects at least one of the control gate lines and selectively activates first and second selection gate lines respectively connected to gates of the first and second selection gate transistors, a bit line control circuit which is supplied with the bit line voltage generated from the booster circuit and performs operations of latching program data and sensing data at the readout time, and a column decoder which selects a column of the memory cell units, wherein the row decoder applies high voltage among the plurality of different intermediate voltages to non-selected control gate lines which lie on the source line side and applies low voltage among the plurality of different intermediate voltages to non-selected control gate lines which lie on the bit line side at the data programming time.

4. The nonvolatile semiconductor memory device according to claim 3, wherein the row decoder applies reference voltage which cuts off the memory transistor to at least one of the non-selected control gate lines which lie on one side or on both sides of the selected control gate line.

5. A nonvolatile semiconductor memory device comprising:
    a memory cell array having a plurality of memory cell blocks arranged in a column direction and n control gate lines provided for each of the plurality of memory cell blocks, each of the memory cell blocks including a plurality of memory cell units arranged in a row direction and each connected to the n control gate lines provided for the memory cell block, each of the plurality of memory cell units including n (n is an integer not smaller than 3) electrically data programmable and erasable memory transistors which are arranged in the column direction and whose current paths are serially connected, a first selection gate transistor having a current path connected at one end to one end of a current path of the series-connected memory transistors and connected at the other end to a bit line, and a second selection gate transistor having a current path connected at one end to the other end of the current path of the series-connected memory transistors and connected at the other end to a source line, and each of the n control gate lines being commonly connected to control gates of those of the memory transistors which are arranged on a corresponding one of rows in the memory cell units of each of the memory cell blocks, and
    a programming circuit configured to program data by holding channel voltage of a selected memory transistor in a selected memory cell unit at a low level when high positive voltage is applied to a selected control gate line and simultaneously to inhibit programming data into all non-selected memory transistors connected to the same selected control gate line by self-boosting channel voltages using capacitive coupling with at least one of the control gate lines,
    wherein a programming process is performed by use of intermediate voltages of m×n types at maximum when sequentially programming data by use of all of the control gate lines in a selected memory cell block by applying first voltage to the selected control gate line, applying m (m is an integer between 2 and (n−1) both inclusive) types of intermediate voltages lower than the first voltage to at least part of non-selected control gate lines other than the selected control gate line and applying m types of intermediate voltages which are the same as or different from the above m types of intermediate voltages to at least part of non-selected control gate lines other than a next selected control gate line which is different from the former selected control gate line in the selected memory cell block when data is programmed by use of the next selected control gate line.

6. The nonvolatile semiconductor memory device according to claim 5, wherein the programming process is performed by sequentially selecting the control gate lines in order from a first control gate line on a source line side to a bit line side when all of the control gate lines in the selected memory cell block are sequentially used for programming.

7. The nonvolatile semiconductor memory device according to claim 5, wherein the number of intermediate voltages lower than the first voltage and applied to the at least part of non-selected control gate lines is 2 (m=2) and the programming process is performed by use of intermediate voltages of 2×n types at maximum when sequentially programming data by use of all of the control gate lines in the selected memory cell block.

8. The nonvolatile semiconductor memory device according to claim 7, wherein the two types of intermediate voltages depending on k (k is an integer between 1 and n both inclusive) and applied to the at least part of non-selected control gate lines when a kth control gate line from the bit line side is selected are respectively set to Vpass1(k), Vpass2(k), then Vpass1(k) is applied to at least part of non-selected control gate lines lying in first to jth (j is an integer between 1 and n both inclusive) positions from the bit line side and Vpass2(k) is applied to at least part of the non-selected control gate lines lying in (j+1)th to nth positions from the bit line side.

9. The nonvolatile semiconductor memory device according to claim 8, wherein the integer j is equal to the integer k.

10. The nonvolatile semiconductor memory device according to claim 8, wherein Vpass1(k) is lower than Vpass2(k) for all of the integers k.

11. The nonvolatile semiconductor memory device according to claim 8, wherein each of Vpass1(k) and Vpass2(k) increases as the integer k decreases.

12. The nonvolatile semiconductor memory device according to claim 5, wherein data programming into the non-selected memory transistors is inhibited by self-boosting voltages of channel regions which belong to all of the memory transistors in each of the non-selected memory cell units and are treated as one integral part by use of capacitive coupling with all of the control gate lines in the non-selected memory cell unit when data is simultaneously programmed into all of the memory transistors connected to the selected control gate line.

13. The nonvolatile semiconductor memory device according to claim 5, wherein data programming into the non-selected memory transistors is inhibited by self-boosting voltage of a channel region limited by at least one memory transistor which is turned OFF by use of capacitive coupling with at least one control gate line in the non-selected memory cell units when data is simultaneously programmed into all of the memory transistors connected to the selected control gate line.

14. A nonvolatile semiconductor memory device comprising:
    a memory cell array having a plurality of memory cell blocks arranged in a column direction and n control gate lines provided for each of the plurality of memory cell blocks, each of the memory cell blocks including a plurality of memory cell units arranged in a row direction and each connected to the n control gate lines, each of the plurality of memory cell units including n (n is an integer not smaller than 3) electrically data programmable and erasable memory transistors which are arranged in the column direction and whose current paths are serially connected, a first selection gate transistor having a current path connected at one end to one end of a current path of the series-connected memory transistors and connected at the other end to a bit line, and a second selection gate transistor having a current path connected at one end to the other end of the current path of the series-connected memory transistors and connected at the other end to a source line, and each of the n control gate lines being commonly connected to control gates of those of the memory transistors which are arranged on a corresponding one of rows in the memory cell units of each of the memory cell blocks, and a programming circuit configured to program data by holding channel voltage of a selected memory transistor in a selected memory cell unit at a low level when high positive voltage is applied to a selected control gate line and simultaneously to inhibit programming data into all non-selected memory transistors connected to the same selected control gate line by self-boosting channel voltages using capacitive coupling with at least one of the control gate lines, wherein first voltage is applied to the selected control gate line, second voltage lower than the first voltage is applied to at least part of non-selected control gate lines on the bit line side with respect to the selected control gate line and third voltage lower than the first voltage is applied to at least part of non-selected control gate lines on the source line side with respect to the selected control gate line when the selected control gate line lies in one of first to ith (i is an integer between 1 and n both inclusive) positions from the bit line side and the first voltage is applied to the selected control gate line, fourth voltage lower than the first voltage is applied to at least part of non-selected control gate lines on the bit line side with respect to the selected control gate line and fifth voltage lower than the first voltage is applied to at least part of non-selected control gate lines on the source line side with respect to the selected control gate line when the selected control gate line lies in one of (i+1)th to nth positions from the bit line side.

15. The nonvolatile semiconductor memory device according to claim 14, wherein a data programming process is performed by sequentially selecting control gate lines from a first control gate line from the source line side to the bit line side when data programming is sequentially performed by use of all of the control gate lines in the selected memory cell block.

16. The nonvolatile semiconductor memory device according to claim 14, wherein the second voltage is lower than the third voltage and the fourth voltage is lower than the fifth voltage.

17. The nonvolatile semiconductor memory device according to claim 14, wherein the second voltage is higher than the fourth voltage and the third voltage is higher than the fifth voltage.

18. The nonvolatile semiconductor memory device according to claim 14, wherein data programming into the non-selected memory transistors is inhibited by self-boosting voltages of channel regions which belong to all of the memory transistors in each of the non-selected memory cell units and are treated as one integral part by use of capacitive coupling with all of the control gate lines in the non-selected memory cell unit when data is simultaneously programmed into all of the memory transistors connected to the selected control gate line.

19. The nonvolatile semiconductor memory device according to claim 14, wherein data programming into the non-selected memory transistors is inhibited by self-boosting voltage of a channel region limited by at least one memory transistor which is turned OFF by use of capacitive coupling with at least one control gate line in the non-selected memory cell units when data is simultaneously programmed into all of the memory transistors connected to the selected control gate line.

20. A nonvolatile semiconductor memory device comprising:

a memory cell array having a plurality of memory cell blocks arranged in a column direction and n control gate lines provided for each of the plurality of memory cell blocks, each of the memory cell blocks including a plurality of memory cell units arranged in a row direction and each connected to the n control gate lines, each of the plurality of memory cell units including n (n is an integer not smaller than 3) electrically data programmable and erasable memory transistors which are arranged in the column direction and whose current paths are serially connected, a first selection gate transistor having a current path connected at one end to one end of a current path of the series-connected memory transistors and connected at the other end to a bit line, and a second selection gate transistor having a current path connected at one end to the other end of the current path of the series-connected memory transistors and connected at the other end to a source line, and each of the n control gate lines being commonly connected to control gates of those of the memory transistors which are arranged on a corresponding one of rows in the memory cell units of each of the memory cell blocks, and a programming circuit configured to program data by holding channel voltage of a selected memory transistor in a selected memory cell unit at a low level when high positive voltage is applied to a selected control gate line and simultaneously to inhibit programming data into all non-selected memory transistors connected to the same selected control gate line by self-boosting channel voltages using capacitive coupling with at least one of the control gate lines, wherein if the selected control gate line lies in a kth (k is an integer between 1 and n both inclusive) position from the bit line side, a programming process is performed by use of Vpass(k) of n types at maximum when data is sequentially programmed via all of the control gate lines in a selected memory cell block by applying first voltage to the selected control gate line and applying Vpass(k) lower than the first voltage and depending on k to at least part of non-selected control gate lines.

21. The nonvolatile semiconductor memory device according to claim 20, wherein the programming process is performed by sequentially selecting the control gate lines in order from a first control gate line from the source line side to the bit line side when data is sequentially programmed via all of the control gate lines in the selected memory cell block.

22. The nonvolatile semiconductor memory device according to claim 20, wherein the voltage Vpass(k) increases as k becomes smaller.

23. The nonvolatile semiconductor memory device according to claim 20, wherein data programming into the non-selected memory transistors is inhibited by self-boosting voltages of channel regions which belong to all of the memory transistors in each of the non-selected memory cell units and are treated as one integral part by use of capacitive coupling with all of the control gate lines in the non-selected memory cell unit when data is simultaneously programmed into all of the memory transistors connected to the selected control gate line.

24. The nonvolatile semiconductor memory device according to claim 20, wherein data programming into the non-selected memory transistors is inhibited by self-boosting voltage of a channel region limited by at least one memory transistor which is turned OFF by use of capacitive coupling with at least one control gate line in the non-selected memory cell units when data is simultaneously programmed into all of the memory transistors connected to the selected control gate line.

25. A nonvolatile semiconductor memory device comprising:

a memory cell array having a plurality of memory cell blocks arranged in a column direction and n control gate lines provided for each of the plurality of memory cell blocks, each of the memory cell blocks including a plurality of memory cell units arranged in a row direction and each connected to the n control gate lines, each of the plurality of memory cell units including n (n is an integer not smaller than 3) electrically data programmable and erasable memory transistors which are arranged in the column direction and whose current paths are serially connected, a first selection gate transistor having a current path connected at one end to one end of a current path of the series-connected memory transistors and connected at the other end to a bit line, and a second selection gate transistor having a current path connected at one end to the other end of the current path of the series-connected memory transistors and connected at the other end to a source line, and each of the n control gate lines being commonly connected to control gates of those of the memory transistors which are arranged on a corresponding one of rows in the memory cell units of each of the memory cell blocks, and a programming circuit configured to program data by holding channel voltage of a selected memory transistor in a selected memory cell unit at a low level when high positive voltage is applied to a selected control gate line and simultaneously to inhibit programming data into all non-selected memory transistors connected to the same selected control gate line by self-boosting channel voltages using capacitive coupling with at least one of the control gate lines, wherein first voltage is applied to the selected control gate line and sixth voltage lower than the first voltage is applied to at least part of non-selected control gate lines when the selected control gate line lies in one of first to ith (i is an integer between 1 and n both inclusive) positions from the bit line side and seventh voltage lower than the first voltage is applied to at least part of non-selected control gate lines when the selected control gate line lies in one of (i+1)th to nth positions from the bit line side.

26. The nonvolatile semiconductor memory device according to claim 25, wherein the programming process is performed by sequentially selecting the control gate lines in order from a first control gate line from the source line side to the bit line side when data is sequentially programmed via all of the control gate lines in the selected memory cell block.

27. The nonvolatile semiconductor memory device according to claim 25, wherein the sixth voltage is higher than the seventh voltage.

28. The nonvolatile semiconductor memory device according to claim 25, wherein data programming into the non-selected memory transistors is inhibited by self-boosting voltages of channel regions which belong to all of the memory transistors in each of the non-selected memory cell units and are treated as one integral part by use of capacitive coupling with all of the control gate lines in the non-selected memory cell unit when data is simultaneously programmed into all of the memory transistors connected to the selected control gate line.

29. The nonvolatile semiconductor memory device according to claim 25, wherein data programming into the non-selected memory transistors is inhibited by self-boosting voltage of a channel region limited by at least one memory transistor which is turned OFF by use of capacitive coupling with at least one control gate line in the non-selected memory cell units when data is simultaneously programmed into all of the memory transistors connected to the selected control gate line.

30. A nonvolatile semiconductor memory device comprising:

a memory cell array having a plurality of memory cell blocks arranged in a column direction and n control gate lines provided for each of the plurality of memory cell blocks, each of the memory cell blocks including a plurality of memory cell units arranged in a row direction and each connected to the n control gate lines, each of the plurality of memory cell units including n (n is an integer not smaller than 3) electrically data programmable and erasable memory transistors which are arranged in the column direction and whose current paths are serially connected, a first selection gate transistor having a current path connected at one end to one end of a current path of the series-connected memory transistors and connected at the other end to a bit line, and a second selection gate transistor having a current path connected at one end to the other end of the current path of the series-connected memory transistors and connected at the other end to a source line, and each of the n control gate lines being commonly connected to control gates of those of the memory transistors which are arranged on a corresponding one of rows in the memory cell units of each of the memory cell blocks, and a programming circuit configured to program data by holding channel voltage of a selected memory transistor in a selected memory cell unit at a low level when high positive voltage is applied to a selected control gate line and simultaneously to inhibit programming data into all non-selected memory transistors connected to the same selected control gate line by self-boosting channel voltages using capacitive coupling with at least one of the control gate lines, wherein first voltage is applied to the selected control gate line and m (m is an integer between 2 and (n−1) both inclusive) types of intermediate voltages which are lower than the first voltage are applied to at least part of non-selected control gate lines which are different from the selected control gate line.

31. The nonvolatile semiconductor memory device according to claim 30, wherein the programming process is performed by sequentially selecting the control gate lines in order from a first control gate line from the source line side to the bit line side when data is sequentially programmed via all of the control gate lines in the selected memory cell block.

32. The nonvolatile semiconductor memory device according to claim 30, wherein the number of intermediate voltages which are lower than the first voltage and applied to the at least part of non-selected control gate lines is 2 (m=2).

33. The nonvolatile semiconductor memory device according to claim 32, wherein eighth voltage is applied to at least part of non-selected control gate lines lying in first to jth (j is an integer between 1 and n both inclusive) positions from the bit line side and ninth voltage is applied to at least part of non-selected control gate lines lying in (j+1)th to nth positions from the bit line side when a kth (k is an integer between 1 and n both inclusive) control gate line from the bit line side is selected.

34. The nonvolatile semiconductor memory device according to claim 33, wherein the integer j is equal to the integer k.

35. The nonvolatile semiconductor memory device according to claim 30, wherein the eighth voltage is lower than the ninth voltage.

36. The nonvolatile semiconductor memory device according to claim 30, wherein data programming into the non-selected memory transistors is inhibited by self-boosting voltages of channel regions which belong to all of the memory transistors in each of the non-selected memory cell units and are treated as one integral part by use of capacitive coupling with all of the control gate lines in the non-selected memory cell unit when data is simultaneously programmed into all of the memory transistors connected to the selected control gate line.

37. The nonvolatile semiconductor memory device according to claim 30, wherein data programming into the non-selected memory transistors is inhibited by self-boosting voltage of a channel region limited by at least one memory transistor which is turned OFF by use of capacitive coupling with at least one control gate line in the non-selected memory cell units when data is simultaneously programmed into all of the memory transistors connected to the selected control gate line.

38. A nonvolatile semiconductor memory device comprising:

a memory cell array having a plurality of memory cell blocks arranged in a column direction and n control gate lines provided for each of the plurality of memory cell blocks, each of the memory cell blocks including a plurality of memory cell units arranged in a row direction and each connected to the n control gate lines, each of the plurality of memory cell units including n (n is an integer not smaller than 3) electrically data programmable and erasable memory transistors which are arranged in the column direction and whose current paths are serially connected, a first selection gate transistor having a current path connected at one end to one end of a current path of the series-connected memory transistors and connected at the other end to a bit line, and a second selection gate transistor having a current path connected at one end to the other end of the current path of the series-connected memory transistors and connected at the other end to a source line, and each of the n control gate lines being commonly connected to control gates of those of the memory transistors which are arranged on a corresponding one of rows in the memory cell units of each of the memory cell blocks, and a programming circuit configured to program data by holding channel voltage of a selected memory transistor in a selected memory cell unit at a low level when high positive voltage is applied to a selected control gate line and simultaneously to inhibit programming data into all non-selected memory transistors connected to the same selected control gate line by self-boosting channel voltages using capacitive coupling with at least one of the control gate lines, wherein a programming system is used in which a memory transistor is cut off by applying first voltage to the selected control gate line and applying second voltage lower than the first voltage to part of non-selected control gate lines to turn off non-selected memory transistors connected to the above non-selected control gate lines and to limit a self-boosting channel region when the selected control gate line is a kth control gate line from the bit line side and the number Nlow(k) (Nlow(k) is an integer not smaller than 0) of control gate lines to which the second voltage is applied is changed depending on k.

39. The nonvolatile semiconductor memory device according to claim 38, wherein the programming process is performed by sequentially selecting the control gate lines in order from a first control gate line from the source line side to the bit line side when data is sequentially programmed via all of the control gate lines in the selected memory cell block.

40. The nonvolatile semiconductor memory device according to claim 38, wherein third voltage which is lower than the first voltage and higher than the second voltage is applied to the control gate lines other than the control gate lines to which the first and second voltages are applied.

41. The nonvolatile semiconductor memory device according to claim 38, wherein the number Nlow(k) is 0 when the integer k is not smaller than j (j is an integer between 1 and n both inclusive) and the number Nlow(k) is not smaller than 1 when the integer k is smaller than j.

* * * * *